(12) United States Patent
Abu-Surra et al.

(10) Patent No.: US 8,560,911 B2
(45) Date of Patent: Oct. 15, 2013

(54) SYSTEM AND METHOD FOR STRUCTURED LDPC CODE FAMILY

(75) Inventors: Shadi Abu-Surra, Richardson, TX (US); Eran Pisek, Plano, TX (US); Zhouyue Pi, Richardson, TX (US)

(73) Assignee: Samsung Electronics Co., Ltd., Suwon-Si (KR)

( * ) Notice: Subject to any disclaimer, the term of this patent is extended or adjusted under 35 U.S.C. 154(b) by 425 days.

(21) Appl. No.: 12/876,903

(22) Filed: Sep. 7, 2010

(65) Prior Publication Data

US 2011/0066916 A1 Mar. 17, 2011

Related U.S. Application Data

(60) Provisional application No. 61/276,761, filed on Sep. 16, 2009, provisional application No. 61/276,595, filed on Sep. 14, 2009, provisional application No. 61/278,811, filed on Oct. 13, 2009.

(51) Int. Cl.
*H03M 13/00* (2006.01)
*H03M 13/35* (2006.01)

(52) U.S. Cl.
USPC .......................................... 714/752; 714/774

(58) Field of Classification Search
USPC ................................. 714/752, 774
See application file for complete search history.

(56) References Cited

U.S. PATENT DOCUMENTS

| | | | |
|---|---|---|---|
| 7,334,181 B2 | 2/2008 | Eroz et al. | |
| 7,343,539 B2 * | 3/2008 | Divsalar et al. | 714/755 |
| 7,480,845 B2 * | 1/2009 | Kim et al. | 714/752 |
| 7,499,490 B2 * | 3/2009 | Divsalar et al. | 375/240 |
| 7,734,988 B2 * | 6/2010 | Kim et al. | 714/774 |
| 7,890,844 B2 * | 2/2011 | Jeong et al. | 714/784 |
| 7,966,548 B2 | 6/2011 | Jacobsen et al. | |
| 7,984,368 B2 * | 7/2011 | Pisek et al. | 714/794 |
| 8,006,162 B2 * | 8/2011 | Choi et al. | 714/758 |
| 8,117,523 B2 * | 2/2012 | Divsalar et al. | 714/801 |
| 8,132,072 B2 * | 3/2012 | El-Khamy et al. | 714/755 |
| 8,161,363 B2 * | 4/2012 | Jeong et al. | 714/801 |

(Continued)

FOREIGN PATENT DOCUMENTS

| | | |
|---|---|---|
| KR | 1020070035283 A | 3/2007 |
| KR | 1020090093763 A | 9/2009 |
| KR | 1020100032346 A | 3/2010 |
| KR | 1020100047155 A | 5/2010 |

OTHER PUBLICATIONS

International Search Report dated May 31, 2011 in connection with International Patent Application No. PCT/KR2010/006362.

(Continued)

*Primary Examiner* — Stephen M Baker

(57) ABSTRACT

A low density parity check (LDPC) family of codes is constructed by: determining a protograph for a mother code for the LDPC family of codes. The protograph is lifted by a lifting factor to design code specific protograph for a code. The method also includes constructing a base matrix for the code. The base matrix is constructed by replacing each zero in the code specific protograph with a '−1'; and replacing each one in the code specific protograph with a corresponding value from the mother matrix. The LDPC code includes a codeword size of at least 1344, a plurality of information bits, and a plurality of parity bits. The LDPC code is based on a mother code of code length 672.

20 Claims, 23 Drawing Sheets

(56) References Cited

U.S. PATENT DOCUMENTS

| | | | |
|---|---|---|---|
| 8,209,592 B2* | 6/2012 | Pisek et al. | 714/801 |
| 8,239,746 B2* | 8/2012 | Divsalar et al. | 714/801 |
| 2006/0203765 A1 | 9/2006 | Laroia et al. | |
| 2006/0294445 A1 | 12/2006 | Divsalar et al. | |
| 2007/0043998 A1 | 2/2007 | Lakkis | |
| 2007/0094568 A1 | 4/2007 | Choi et al. | |
| 2007/0162815 A1 | 7/2007 | El-Khamy et al. | |
| 2008/0126916 A1 | 5/2008 | Chung et al. | |
| 2008/0178065 A1 | 7/2008 | Khandekar et al. | |
| 2009/0013239 A1 | 1/2009 | Blanksby | |
| 2009/0070659 A1 | 3/2009 | Zhong et al. | |
| 2011/0047433 A1 | 2/2011 | Abu-Surra et al. | |
| 2011/0299484 A1 | 12/2011 | Nam et al. | |
| 2011/0307760 A1 | 12/2011 | Pisek et al. | |

OTHER PUBLICATIONS

Written Opinion of the International Searching Authority dated May 31, 2011 in connection with International Patent Application No. PCT/KR2010/006362.

Sunghwan Kim, et al., "Quasi-Cyclic Low-Density Parity-Check Codes With Girth Larger Than 12", IEEE Transactions on Information Theory, vol. 53, No. 8, Aug. 2007, p. 2885-2891.

Eran Sharon, et al., "Generating Good Finite Length LDPC Codes Based on Lifted Graphs", Forty-Fourth Annual Allerton Conference, Sep. 27-29, 2006, p. 41-50.

Gianluigi Liva, et al., "Design of LDPC Codes: A Survey and New Results", J. Comm. Software and Systems, Sep. 2006, 22 pages.

Andrew Blanksby, et al., "LDPC Code Set for mmWave Communication", mmCom '10, Sep. 24, 2010, p. 39-43.

Shadi Abu-Surra, et al., "Gigabit Rate Achieving Low-Power LDPC Codes: Design and Architecture", 6 pages.

Thomas Henige, et al., "High-Throughput Low-Power LDPC Decoder and Code Design", 2011, 6 pages.

"3rd Generation Partnership Project; Technical Specification Group Radio Access Network; Evolved Universal Terrestrial Radio Access (E-UTRA); Ohysical Channels and Modulation (Release 9)", 3GPP TS 36.211 v9.1.0, Mar. 2010, 85 pages.

International Search Report dated Feb. 23, 2012 in connection with International Patent Application No. PCT/KR2011/004051.

N. Jacobsen, et al., "Design of rate-compatible irregular LDPC codes based on edge growth and parity splitting", in Proc. IEEE Vehicular Technology Conference (VTC); 30 2007; Oct. 3, 2007, p. 1052-1056.

H-G Joo, et al., "New Construction of Rate-Compatible Block-Type Low-Desity Parity-Check Codes Using Splitting", Proc. IEEE (PIMRC 2006), Sep. 2006, 5 pages.

Notification of Transmittal of the International Search Report and the Written Opinion of the International Searching Authority dated Feb. 10, 2012 in connection with International Patent Application No. PCT/KR2011/004351.

Written Opinion of the International Searching Authority dated Feb. 23, 2012 in connection with International Patent Application No. PCT/KR2011/004051.

Office Action dated Jul. 19, 2013 in connection with U.S. Appl. No. 13/159,091.

* cited by examiner

FIG. 5

| | | | | | | | | | | | | | | | |
|---|---|---|---|---|---|---|---|---|---|---|---|---|---|---|---|
| 29 | 30 | 0 | 8 | 33 | 22 | 17 | 4 | 27 | 28 | 20 | 27 | 24 | 23 | -1 | -1 |
| 37 | 31 | 18 | 23 | 11 | 21 | 6 | 20 | 32 | 9 | 12 | 29 | 10 | 0 | 13 | -1 |
| 25 | 22 | 4 | 34 | 31 | 3 | 14 | 15 | 4 | 2 | 14 | 18 | 13 | 13 | 22 | 24 |

| | | | | | | | | | | | | | | | |
|---|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 0 | 0 |
| 1 | 1 | 1 | 1 | 1 | 1 | 1 | 1 | 1 | 1 | 1 | 1 | 1 | 1 | 1 | 0 |
| 1 | 1 | 1 | 1 | 1 | 1 | 1 | 1 | 1 | 1 | 1 | 1 | 1 | 1 | 1 | 1 |

| | | | | | | | | | | | | | | | |
|---|---|---|---|---|---|---|---|---|---|---|---|---|---|---|---|
| 0 | 0 | 0 | 1 | 1 | 1 | 1 | 0 | 1 | 1 | 1 | 1 | 0 | 0 | -1 | -1 |
| 0 | 0 | 1 | 1 | 1 | 0 | 0 | 0 | 0 | 0 | 1 | 0 | 0 | 1 | -1 | 1 |
| 0 | 0 | 0 | 0 | 1 | 0 | 0 | 1 | 1 | 1 | 1 | 1 | 1 | 0 | 0 | 1 |

| 34 | -1 | -1 | -1 | 14 | -1 | -1 | -1 | 4  | -1 | -1 | 20 | -1 | -1 | -1 | -1 |
| -1 | -1 | 34 | 14 | -1 | -1 | -1 | -1 | -1 | -1 | 4  | -1 | -1 | 20 | -1 | -1 |
| -1 | 34 | -1 | -1 | -1 | 14 | -1 | -1 | -1 | 4  | -1 | -1 | 20 | -1 | -1 | -1 |
| -1 | -1 | 41 | -1 | -1 | 20 | -1 | 39 | -1 | -1 | -1 | -1 | -1 | -1 | -1 | 14 |
| -1 | 41 | -1 | -1 | 20 | -1 | 39 | -1 | -1 | -1 | -1 | -1 | -1 | -1 | 14 | -1 |
| 41 | -1 | -1 | 20 | -1 | -1 | -1 | 39 | -1 | -1 | -1 | -1 | -1 | -1 | -1 | 14 |
| -1 | -1 | 7  | -1 | -1 | 12 | -1 | -1 | -1 | 22 | -1 | -1 | 21 | -1 | -1 | -1 |
| -1 | 7  | -1 | -1 | 12 | -1 | -1 | -1 | 22 | -1 | -1 | 21 | -1 | -1 | -1 | -1 |
| 7  | -1 | -1 | 12 | -1 | -1 | -1 | -1 | -1 | 22 | -1 | 21 | -1 | -1 | -1 | -1 |
| -1 | 20 | -1 | -1 | -1 | -1 | -1 | 40 | -1 | -1 | -1 | -1 | -1 | -1 | -1 | 31 |
| 20 | -1 | -1 | -1 | -1 | -1 | 40 | -1 | -1 | -1 | -1 | -1 | -1 | -1 | 31 | -1 |
| -1 | -1 | 20 | -1 | -1 | 40 | -1 | -1 | -1 | -1 | -1 | -1 | -1 | 31 | -1 | -1 |
| -1 | 31 | -1 | -1 | 18 | -1 | -1 | -1 | -1 | -1 | -1 | -1 | 23 | -1 | -1 | 34 |
| 31 | -1 | -1 | 18 | -1 | -1 | -1 | -1 | -1 | -1 | -1 | 23 | -1 | -1 | 34 | -1 |
| -1 | -1 | 31 | 18 | -1 | -1 | -1 | -1 | -1 | -1 | 23 | -1 | -1 | 34 | -1 | -1 |
| -1 | -1 | 34 | -1 | -1 | -1 | -1 | 41 | 0  | -1 | -1 | -1 | -1 | -1 | -1 | -1 |
| -1 | 34 | -1 | -1 | -1 | -1 | 41 | -1 | -1 | 0  | -1 | -1 | -1 | -1 | -1 | -1 |
| 34 | -1 | -1 | -1 | -1 | 41 | -1 | -1 | 0  | -1 | -1 | -1 | -1 | -1 | -1 | -1 |
| -1 | 36 | -1 | 27 | -1 | -1 | -1 | -1 | -1 | -1 | 31 | -1 | -1 | -1 | 22 | -1 |
| 36 | -1 | -1 | -1 | 27 | -1 | -1 | -1 | -1 | -1 | -1 | 31 | 22 | -1 | -1 | -1 |
| -1 | -1 | 36 | -1 | 27 | -1 | -1 | -1 | -1 | -1 | 31 | -1 | -1 | -1 | -1 | 22 |
| 20 | -1 | -1 | -1 | 30 | -1 | -1 | 35 | -1 | 29 | -1 | -1 | -1 | -1 | -1 | -1 |
| -1 | -1 | 20 | 30 | -1 | -1 | 35 | -1 | 29 | -1 | -1 | -1 | -1 | -1 | -1 | -1 |
| -1 | 20 | -1 | -1 | 30 | 35 | -1 | -1 | -1 | 29 | -1 | -1 | -1 | -1 | -1 | -1 |

SYSTEM AND METHOD FOR STRUCTURED LDPC CODE FAMILY

CROSS-REFERENCE TO RELATED APPLICATION(S) AND CLAIM OF PRIORITY

The present application is related to U.S. Provisional Patent Application No. 61/276,761, filed Sep. 16, 2009, entitled "STRUCTURED LDPC CODE FAMILY WITH CODE LENGTHS 1344 AND 2688 AND LIFTING FACTOR 42", U.S. Provisional Patent No. 61/276,595, filed Sep. 14, 2009, entitled "STRUCTURED LDPC CODE FAMILY WITH FIXED CODE LENGTH AND NO PUNCTURING II" and U.S. Provisional Patent No. 61/278,811, filed Oct. 13, 2009, entitled "STRUCTURED LDPC CODE FAMILY WITH CODE LENGTH 2016 AND LIFTING FACTOR 42". Provisional Patent Application Nos. 61/276,761, 61/276,595, and 61/278,811 are assigned to the assignee of the present application and is hereby incorporated by reference into the present application as if fully set forth herein. The present application hereby claims priority under 35 U.S.C. §119(e) to U.S. Provisional Patent Application Nos. 61/276,761, 61/276,595 and 61/278,811.

The present application is related to U.S. patent application Ser. No. 12/855,442, filed Aug. 12, 2010, entitled "SYSTEM AND METHOD FOR STRUCTURED LDPC CODE FAMILY WITH FIXED CODE LENGTH AND NO PUNCTURING". Patent application Ser. No. 12/855,442 is assigned to the assignee of the present application and is hereby incorporated by reference into the present application as if fully set forth herein.

TECHNICAL FIELD OF THE INVENTION

The present application relates generally to wireless communications devices and, more specifically, to decoding data received by a wireless communication device.

BACKGROUND OF THE INVENTION

In information theory, a low-density parity-check (LDPC) code is an error correcting code for transmitting a message over a noisy transmission channel. LDPC codes are a class of linear block codes. While LDPC and other error correcting codes cannot guarantee perfect transmission, the probability of lost information can be made as small as desired. LDPC was the first code to allow data transmission rates close to the theoretical maximum known as the Shannon Limit. LDPC codes can perform with 0.0045 dB of the Shannon Limit. LDPC was impractical to implement when developed in 1963. Turbo codes, discovered in 1993, became the coding scheme of choice in the late 1990s. Turbo codes are used for applications such as deep-space satellite communications. LDPC requires complex processing but is the most efficient scheme discovered as of 2007. LDPC codes can yield a large minimum distance (hereinafter "$d_{min}$") and reduce decoding complexity.

SUMMARY OF THE INVENTION

A method for constructing a low density parity check (LDPC) family of codes is provided. The method includes determining a protograph for a mother code for the LDPC family of codes. The protograph is lifted by a lifting factor to design code specific protograph for a code. The method also includes constructing a base matrix for the code. The base matrix is constructed by replacing each zero in the code specific protograph with a '−1'; and replacing each one in the code specific protograph with a corresponding value from the mother matrix.

A low density parity check (LDPC) code is provided. The LDPC code includes a codeword size of at least 1344, a plurality of information bits, and a plurality of parity bits. The LDPC code is based on a mother code of code length 672. The LDPC code is constructed by: determining a protograph for a mother code for the LDPC family of codes; lifting the protograph by a lifting factor to design code specific protograph for a code; and constructing a base matrix for the code. The base matrix constructed by: replacing each zero in the code specific protograph with a '−1'; and replacing each one in the code specific protograph with a corresponding value from the mother matrix.

A method for performing error correction is provided. The method includes using a low density parity check (LDPC) code from a LDPC family of codes. The LDPC code includes a codeword size of at least 1344, a plurality of information bits, and a plurality of parity bits, wherein the LDPC code is based on a mother code. The LDPC code is constructed by determining a protograph for a mother code for the LDPC family of codes, lifting the protograph by a lifting factor to design code specific protograph for a code, and constructing a base matrix for the code. The base matrix is constructed by replacing each zero in the code specific protograph with a '−1'; and replacing each one in the code specific protograph with a corresponding value from the mother matrix.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 5 illustrates a mother code according to embodiments of the present disclosure;

FIG. 7 illustrates a protograph for the mother code according to embodiments of the present disclosure;

FIG. 8 illustrates a designed lifting with a lifting factor of 2 according to embodiments of the present disclosure;

FIG. 9 illustrates a $13/16$ protograph according to embodiments of the present disclosure;

FIG. 10 illustrates a $13/16$ code with length 1344 according to embodiments of the present disclosure;

FIGS. 11A through 11K illustrate lifting rates according to embodiments of the present disclosure; and FIGS. 12A through 12K illustrate LDPC code families according to embodiments of the present disclosure.

DETAILED DESCRIPTION OF THE INVENTION

FIGS. 1 through 12K, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication system.

Figure 1:
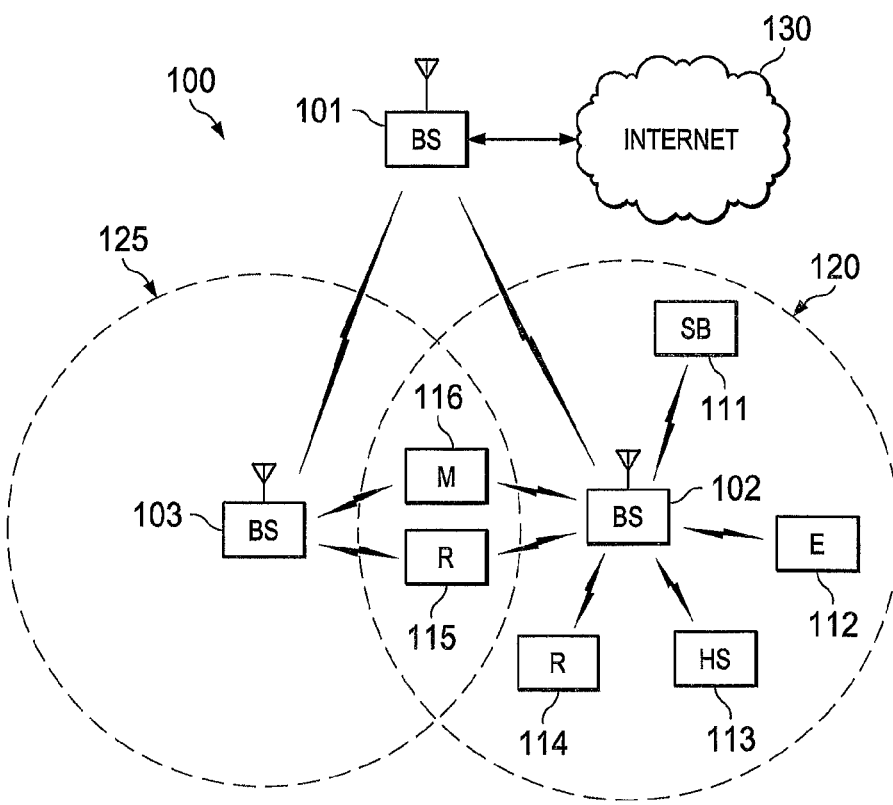
FIG. 1 illustrates an exemplary wireless network 100, which transmits ACK/NACK messages according to an exemplary embodiment of the disclosure.

FIG. 1 illustrates an exemplary wireless network 100, which transmits ACK/NACK messages according to the principles of the present disclosure. In the illustrated embodiment, wireless network 100 includes base station (BS) 101, base station (BS) 102, base station (BS) 103, and other similar base stations (not shown). Base station 101 is in communication with base station 102 and base station 103. Base station 101 is also in communication with Internet 130 or a similar IP-based network (not shown).

Base station 102 provides wireless broadband access (via base station 101) to Internet 130 to a first plurality of subscriber stations within coverage area 120 of base station 102. The first plurality of subscriber stations includes subscriber station 111, which may be located in a small business (SB), subscriber station 112, which may be located in an enterprise (E), subscriber station 113, which may be located in a wireless fidelity (WiFi) hotspot (HS), subscriber station 114, which may be located in a first residence (R), subscriber station 115, which may be located in a second residence (R), and subscriber station 116, which may be a mobile device (M), such as a cell phone, a wireless laptop, a wireless PDA, or the like.

Base station 103 provides wireless broadband access (via base station 101) to Internet 130 to a second plurality of subscriber stations within coverage area 125 of base station 103. The second plurality of subscriber stations includes subscriber station 115 and subscriber station 116. In an exemplary embodiment, base stations 101-103 may communicate with each other and with subscriber stations 111-116 using OFDM or OFDMA techniques.

Base station 101 may be in communication with either a greater number or a lesser number of base stations. Furthermore, while only six subscriber stations are depicted in FIG. 1, it is understood that wireless network 100 may provide wireless broadband access to additional subscriber stations. It is noted that subscriber station 115 and subscriber station 116 are located on the edges of both coverage area 120 and coverage area 125. Subscriber station 115 and subscriber station 116 each communicate with both base station 102 and base station 103 and may be said to be operating in handoff mode, as known to those of skill in the art.

Subscriber stations 111-116 may access voice, data, video, video conferencing, and/or other broadband services via Internet 130. In an exemplary embodiment, one or more of subscriber stations 111-116 may be associated with an access point (AP) of a WiFi WLAN. Subscriber station 116 may be any of a number of mobile devices, including a wireless-enabled laptop computer, personal data assistant, notebook, handheld device, or other wireless-enabled device. Subscriber stations 114 and 115 may be, for example, a wireless-enabled personal computer (PC), a laptop computer, a gateway, or another device.

Embodiments of the present disclosure provide for a decoder configured to operate in a Wireless Gigabit (WiGig) system. The system 100 can be configured to operate as or in the WiGig system. The WiGig system is a global wireless system that enables multi-gigabit-speed wireless communications among high performance devices using the unlicensed 60 GHz spectrum.

Figure 2A:
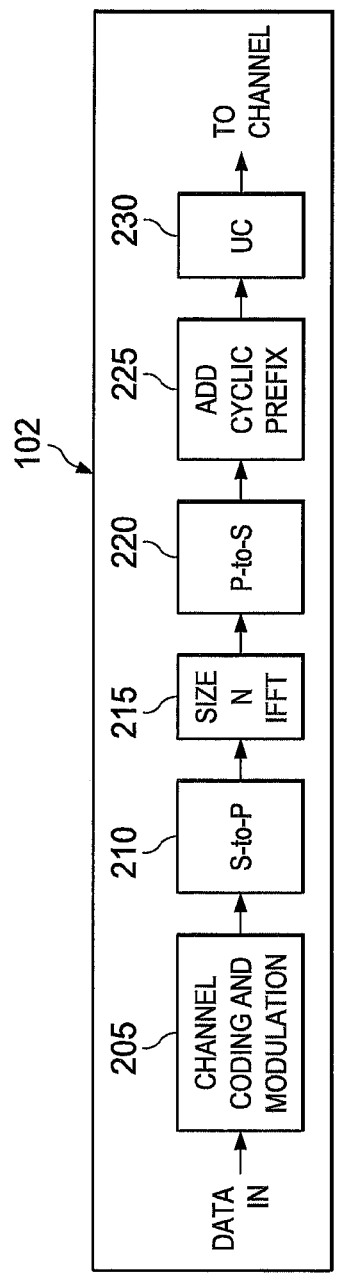
FIG. 2A illustrates a high-level diagram of an orthogonal frequency division multiple access transmit path according to an exemplary embodiment of the disclosure.
Figure 2B:
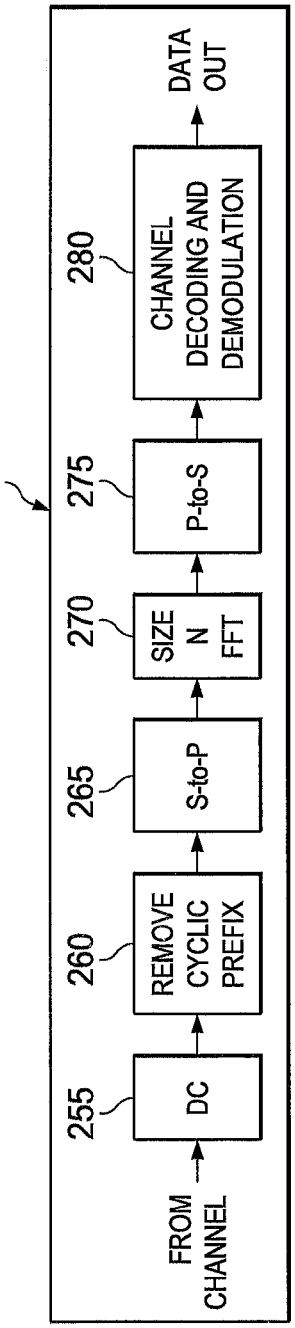
FIG. 2B illustrates a high-level diagram of an orthogonal frequency division multiple access receive path according to an exemplary embodiment of the disclosure.

FIG. 2A is a high-level diagram of an orthogonal frequency division multiple access (OFDMA) transmit path. FIG. 2B is a high-level diagram of an orthogonal frequency division multiple access (OFDMA) receive path. In FIGS. 2A and 2B, the OFDMA transmit path is implemented in base station (BS) 102 and the OFDMA receive path is implemented in subscriber station (SS) 116 for the purposes of illustration and explanation only. However, it will be understood by those skilled in the art that the OFDMA receive path may also be implemented in BS 102 and the OFDMA transmit path may be implemented in SS 116.

The transmit path in BS 102 comprises channel coding and modulation block 205, serial-to-parallel (S-to-P) block 210, Size N Inverse Fast Fourier Transform (IFFT) block 215, parallel-to-serial (P-to-S) block 220, add cyclic prefix block 225, up-converter (UC) 230. The receive path in SS 116 comprises down-converter (DC) 255, remove cyclic prefix block 260, serial-to-parallel (S-to-P) block 265, Size N Fast Fourier Transform (FFT) block 270, parallel-to-serial (P-to-S) block 275, channel decoding and demodulation block 280.

At least some of the components in FIGS. 2A and 2B may be implemented in software while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation. In addition, the BS 102 can include one or more controllers configured to implement the paths in FIGS. 2A and 2B.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 2, 3, 4, etc.), while for FFT and IFFT functions, the value of the N variable may be any integer number that is a power of two (i.e., 1, 2, 4, 8, 16, etc.).

In BS 102, channel coding and modulation block 205 receives a set of information bits, applies coding (e.g., LDPC coding) and modulates (e.g., QPSK, QAM) the input bits to produce a sequence of frequency-domain modulation symbols. Serial-to-parallel block 210 converts (i.e., de-multiplexes) the serial modulated symbols to parallel data to produce N parallel symbol streams where N is the IFFT/FFT size used in BS 102 and SS 116. Size N IFFT block 215 then performs an IFFT operation on the N parallel symbol streams to produce time-domain output signals. Parallel-to-serial block 220 converts (i.e., multiplexes) the parallel time-domain output symbols from Size N IFFT block 215 to produce a serial time-domain signal. Add cyclic prefix block 225 then inserts a cyclic prefix to the time-domain signal. Finally, up-converter 230 modulates (i.e., up-converts) the output of add cyclic prefix block 225 to RF frequency for transmission via a wireless channel. The signal may also be filtered at baseband before conversion to RF frequency.

The transmitted RF signal arrives at SS 116 after passing through the wireless channel and reverse operations to those at BS 102 are performed. Down-converter 255 down-converts the received signal to baseband frequency and remove cyclic prefix block 260 removes the cyclic prefix to produce the serial time-domain baseband signal. Serial-to-parallel block 265 converts the time-domain baseband signal to parallel time domain signals. Size N FFT block 270 then performs an FFT algorithm to produce N parallel frequency-domain signals. Parallel-to-serial block 275 converts the parallel frequency-domain signals to a sequence of modulated data symbols. Channel decoding and demodulation block 280 demodulates and then decodes the modulated symbols to recover the original input data stream.

Each of base stations 101-103 may implement a transmit path that is analogous to transmitting in the downlink to subscriber stations 111-116 and may implement a receive path that is analogous to receiving in the uplink from subscriber stations 111-116. Similarly, each one of subscriber stations 111-116 may implement a transmit path corresponding to the architecture for transmitting in the uplink to base stations 101-103 and may implement a receive path corresponding to the architecture for receiving in the downlink from base stations 101-103.

The channel decoding and demodulation block 280 decodes the received data. The channel decoding and demodulation block 280 includes a decoder configured to perform a low density parity check decoding operation. In some embodiments, the channel decoding and demodulation block 280 comprises one or more Context-based operation Reconfigurable Instruction Set Processors (CRISPs) such as the CRISP processor described in one or more of application Ser. No. 11/123,313 filed May 6, 2005, entitled "CONTEXT-BASED OPERATION RECONFIGURABLE INSTRUCTION SET PROCESSOR AND METHOD OF OPERATION" (now U.S. Pat. No. 7,668,992); application Ser. No. 11,142,504 filed Jun. 1, 2005 entitled "MULTISTANDARD SDR ARCHITECTURE USING CONTEXT-BASED OPERATION RECONFIGURABLE INSTRUCTION SET PROCESSORS" (now U.S. Pat. No. 7,769,912); U.S. Pat. No. 7,483,933 issued Jan. 27, 2009 entitled "CORRELATION ARCHITECTURE FOR USE IN SOFTWARE-DEFINED RADIO SYSTEMS"; application Ser. No. 11/225, 479 filed Sep. 13, 2005, entitled "TURBO CODE DECODER ARCHITECTURE FOR USE IN SOFTWARE-DEFINED RADIO SYSTEMS" (now U.S. Pat. No. 7,571, 369); and application Ser. No. 11/501,577 filed Aug. 9, 2006, entitled "MULTI-CODE CORRELATION ARCHITECTURE FOR USE IN SOFTWARE-DEFINED RADIO SYSTEMS", all of which are hereby incorporated by reference into the present application as if fully set forth herein.

Figure 3:
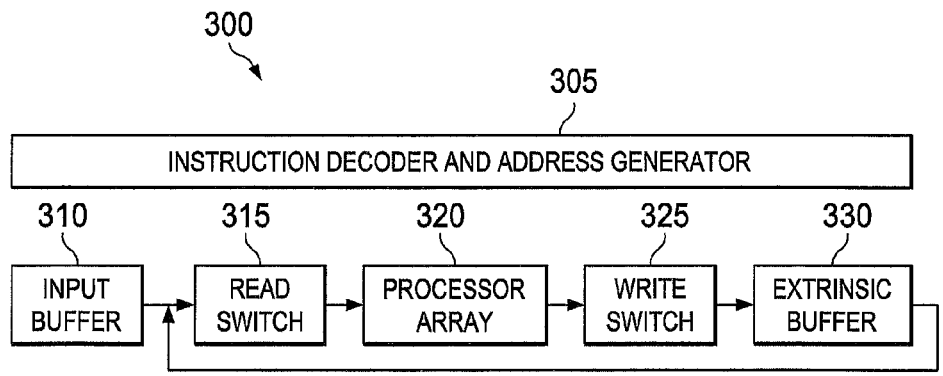
FIG. 3 illustrates a LDPC CRISP top-level architecture according to embodiments of the present disclosure.

FIG. 3 illustrates a LDPC CRISP top-level architecture according to embodiments of the present disclosure. The embodiment of the LDPC CRISP top-level architecture 300 shown in FIG. 3 is for illustration only. Other embodiments of the LDPC CRISP top-level architecture 300 could be used without departing from the scope of this disclosure.

The LDPC CRISP 300 includes an instruction decoder & address generator block 305. In some embodiments, the instruction decoder & address generator block 305 is a programmable finite state machine. In some embodiments, the instruction decoder & address generator block 305 operates as a controller for the LDPC CRISP 300 and its components. The LDPC CRISP 300 also includes an input buffer block 310, a read switch block 315, a processor array 320, a write switch block 325 and an extrinsic buffer block 330. In some embodiments (not specifically illustrated), the input buffer block 310 includes extrinsic buffer block 330 (e.g., the input buffer block 310 and extrinsic buffer 330 can be the same block).

The instruction decoder & address generator block 305 includes a plurality of instructions to control operations of the LDPC CRISP 300. In some embodiments, a portion (e.g., some or all) of the plurality of instructions is reconfigurable to vary the operation of the LDPC CRISP 300. The plurality of instructions can be reconfigured to have the LDPC CRISP 300 perform Serial-V decoding or Serial-C decoding. Additionally, the plurality of instructions can be reconfigured to have the LDPC CRISP 300 perform decoding by a flooding technique, sum products technique or min-sum technique. The plurality of instructions also can be reconfigured to vary a number of iterations performed such that the LDPC CRISP 300 only performs a number of iterations or continue to perform iterations until a specified event occurs or a specified amount of time lapses. Further, the plurality of instructions can be reconfigured to have the LDPC CRISP 300 perform decoding for any one or more of IEEE 802.16e (hereinafter "WiMax"), Digital Video Broadcasting-Satellite-Second Generation (hereinafter "DVB-S2") and International Mobile Telecommunications-Advanced (hereinafter "IMT-Advanced" or "4G"). The LDPC CRISP can be applied to any system that incorporates an LDPC decoding algorithm including, but not limited to, CDMA, OFDMA, WiMax, third generation (3G) and fourth generation (4G) systems. Additionally, the plurality of instructions can be reconfigured to have the LDPC CRISP 300 vary the number of LDPC CRISP decoder units for use in the decoding operation. The instruction decoder & address generator block 305 also is configured to store an H-matrix (discussed herein below with respect to FIGS. 5, 10 through 12, 15 and 17 through 19).

The input buffer block 310 is configured to receive data (e.g., codewords or symbols). The input buffer block 310 includes a number of memory blocks for storing the received data. In some embodiments, the input buffer block 310 includes twenty-four (24) memory blocks for storing the received data.

The read switch also reads the H-matrix from the instruction decoder & address generator block 305. The read switch 315 is configured to read the received data from the input buffer block 310. The read switch 315 uses the H-matrix to determine from where to read the data from the input buffer 310. The read switch 315 is configured to apply a Z-factor right shift multiplexor (MUX) operation to the received data read from the input buffer block 310. The Z-factor right shift multiplexor (MUX) operation is based on the shift data computed from the H-matrix or the shift vector (discussed herein below with respect to FIGS. 5A and 5B).

The processor array 320 includes a number of processor elements. Each of the processor elements includes a plurality of processors configured to perform a flooding technique, sum products technique or min-sum technique. For example, the processor 320 can be configured to find minimum values using a min-sum technique. Further, the processor array 320 is configured to perform decoding for any one or more of WiMax, DVB-S2 and 4G. In some embodiments, the processor array 320 includes four (4) processor elements, each processor element including twenty-four (24) processors. In such embodiments, the LDPC CRISP 300 is referenced herein as a 2/4-unit LDPC decoder CRISP 300.

The write switch block 325 is configured to receive Min/Next Min selection & sums from the processor array 320. The write switch block 325 further is configured to apply a Z-factor left shift MUX operation to the Min/Next Min selection & sums received from the processor array 320 to generate a set of output extrinsic data. Further, the write switch block 325 is configured to write the output extrinsic data of the write switch block 325 to extrinsic buffer block 330. For example, the write switch block 325 is configured to use the H-matrix to reverse of the operation performed by read switch 315.

The extrinsic buffer block 330 is configured to store the output extrinsic data in a number of memory units. In some embodiments, the extrinsic buffer block 330 includes twenty-four (24) memory units. The extrinsic buffer block 330 also is coupled to the read switch 315 such that the read switch 315 can read the output extrinsic data (hereinafter also "extrinsic output").

The LDPC CRISP 300 is, thus, able to perform a number of iterations of the received data. The LDPC CRISP 300 is operable to read the input data and apply a decoding process to the input data to output an extrinsic data. Thereafter, the LDPC CRISP 300 performs one or more iterations of the decoding process using extrinsic data from the previous decoding process as the input for the next decoding process. As such, the input data is used only once and, thereafter, the LDPC CRISP 300 generates the extrinsic data for use in the subsequent iterations.

The LDPC CRISP 300 can be configured to perform iterations until a cessation event occurs. For example, the LDPC CRISP 300 can be configured to perform a specified number of iterations. Additionally, the LDPC CRISP 300 can be configured to perform iterations until the extrinsic data reaches a specified value (e.g., a convergence point). Further, the LDPC CRISP 300 can be configured to perform iterations until a most significant bit (MSB) output is unchanged for several consecutive iterations.

LDPC codes are linear codes that can be characterized by sparse parity check matrices H. The H-matrix has a low density of one's (1's). The sparseness of H yields a large $d_{min}$ and reduces decoding complexity. An exemplary H-matrix is represented by Equation 1a:

$$H = \begin{bmatrix} 1 & 1 & 1 & 1 & 0 & 1 & 0 & 1 & 0 & 1 \\ 1 & 0 & 1 & 1 & 0 & 0 & 1 & 1 & 1 & 1 \\ 0 & 1 & 0 & 1 & 0 & 0 & 0 & 1 & 0 & 0 \\ 1 & 0 & 0 & 0 & 1 & 0 & 1 & 1 & 1 & 1 \\ 0 & 0 & 1 & 1 & 1 & 0 & 1 & 0 & 1 & 0 \end{bmatrix}. \quad \text{[Eqn. 1a]}$$

Another exemplary H-matrix is represented by Equation 1b:

$$H = \begin{bmatrix} 1 & 1 & 0 & 1 & 0 & 0 \\ 1 & 0 & 1 & 0 & 1 & 0 \\ 0 & 1 & 1 & 0 & 0 & 1 \end{bmatrix}. \quad \text{[Eqn. 1b]}$$

An LDPC code is regular if: every row has the same weight, row weight ($W_r$); and every column has the same weight, column weight ($W_c$). The regular LDPC code is denoted by ($W_c$, $W_r$)-regular. Otherwise, the LDPC code is irregular. Regular codes are easier to implement and analyze. Further, regular codes have lower error floors. However, irregular codes can get closer to capacity than regular codes.

FIGS. 4A through 4D illustrate Tanner graphs corresponding to a parity check matrix according to embodiments of the present disclosure. The embodiments of the Tanner graphs shown in FIGS. 4A through 4D are for illustration only. Other embodiments of the Tanner graphs could be used without departing from the scope of this disclosure.

The Tanner graph 400 is a bipartite graph. In bipartite graphs, nodes are separated into two distinctive sets and edges are only connecting nodes of two different types. The two types of nodes in the Tanner graph 400 are referred to as Variable Nodes (hereinafter "v-nodes") and Check Nodes (hereinafter "c-nodes")

V-nodes correspond to bits of the codeword or, equivalently, to columns of the parity check H-matrix. There are n v-nodes. V-nodes are also referenced as "bit nodes". C-nodes correspond to parity check equations or, equivalently, to rows of the parity check H-matrix. There are at least m=n−k c-nodes.

The Tanner graph 400 corresponds to the parity check H-matrix illustrated by Equation 1a. In addition, the Tanner graph 405 corresponds to the parity check H-matrix illustrated by Equation 1b. The Tanner graph 400 includes five (5) c-nodes (the number of parity bits) and ten (10) v-nodes (the number of bits in a codeword). C-node $f_i$ is connected to v-node $c_j$ if the element $h_{ij}$ of H-matrix is a one (1). For example, c-node $f_0$ is connected to $c_0, c_1, c_2, c_3, c_5, c_7$ and $c_9$. The connection between $f_0$ and $c_0$ corresponds to $h_{00}$; the connection between $f_0$ and $c_2$ corresponds to $h_{01}$; and so on. Therefore, the connections to $f_0$ correspond to the first row in the H-matrix, further illustrated in Equation 2:

$$\overline{H}_0 = [1\ 1\ 1\ 1\ 0\ 1\ 0\ 1\ 0\ 1]. \quad \text{[Eqn. 2]}$$

A degree of a node is the number of edges (e.g., connections) connected to the node. An attractive property of protograph-based codes is that their performance can be predicted from the protograph. The code rate of the derived graph is the same as that computed from the protograph, the code length is equal to the number of VNs in the protograph times Z, and more important the minimum signal-to-noise ratio (SNR) required for successful decoding (called protograph threshold) can be computed for the protograph using protograph EXIT analysis, as described in G. Liva, and M. Chiani "Protograph LDPC Codes Design Based on EXIT Analysis," *IEEE Global Telecommunication Conference, GLOBECOM* 2007, the contents of which are hereby incorporated by reference. The protograph threshold serves as a good indicator on the performance of the derived LDPC code. The threshold SNR is achievable if the derived graph is cycle-free. A cycle is a total length, in the Tanner graph 400, of a path of distinct edges that closes upon itself. The number of edges in this closed path is called the size of the cycle. A path 402 from $c_1 \to f_2 \to c_2 \to f_0 \to c_1$ is an example of a short cycle of size 4 (illustrated by the bold line in FIG. 4A). Short cycles should be avoided since short cycles adversely affect decoding performance. Short cycles manifest themselves in the H-matrix by columns with an overlap two (2). For this reason (which also related to the iterative decoding performance), it is desirable to maximize the size of the smallest cycle in the LDPC code's graph. In general, progressive edge growth (PEG) algorithm is used to select the suitable circulant permutations to maximize the size of the smallest cycles in the LDPC code's graph.

Theoretically, there are no constraints on the locations of the ones in the code's parity check matrix. Therefore, the ones can be very random. However, for practical considerations, it may be preferable to have some structure in the locations of these ones. Consequently, a class of LDPC codes appeared in the industry called protograph-based LDPC codes, as discussed in J. Thorpe, "Low-density parity-check (LDPC) codes constructed from protographs," Tech. Rep. 42-154, IPN Progress Report, August 2003, the contents of which are hereby incorporated. Protographs are further described in D. Divsalar, S. Dolinar, and C. Jones, "Protograph LDPC codes over burst erasure channels," *IEEE Military Commun. Conf., MILCOM* 2006, the contents of which are incorporated by reference. A protograph is a relatively small Tanner graph, such as Tanner graph 410 in FIG. 4C, from which a larger graph can be obtained by the following copy-and-permute procedure. Each edge in the protograph is assigned a different "type" and then the protograph is copied Z times, after which the edges of the same type among the replicas are permuted and reconnected to obtain a single, large graph. Parallel edges are allowed in the protograph, but not in the derived graph. It should be noted that the copy-and-permute procedure described in the definition can be simply represented by replacing each node in the protograph with a vector of nodes of the same type and replacing each edge in the protograph with a bundle of (permuted) edges of the same type.

Figure 4A:
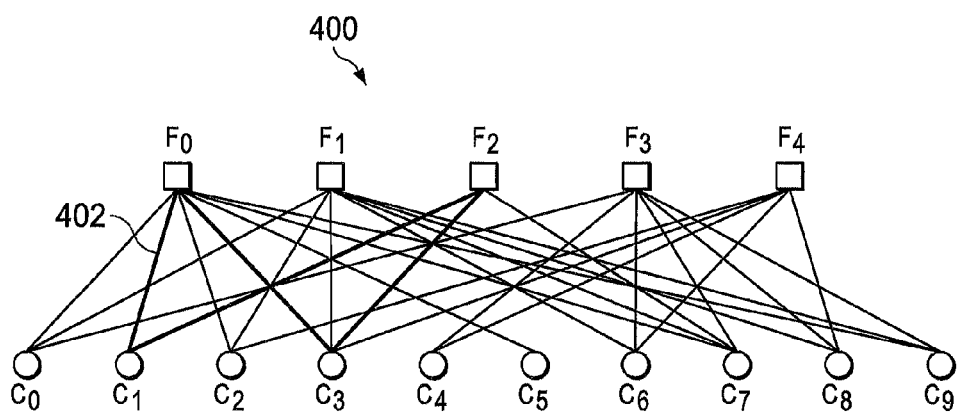
FIGS. 4A through 4D illustrate a Tanner graphs corresponding to a parity check matrix according to embodiments of the present disclosure.
Figure 4B:
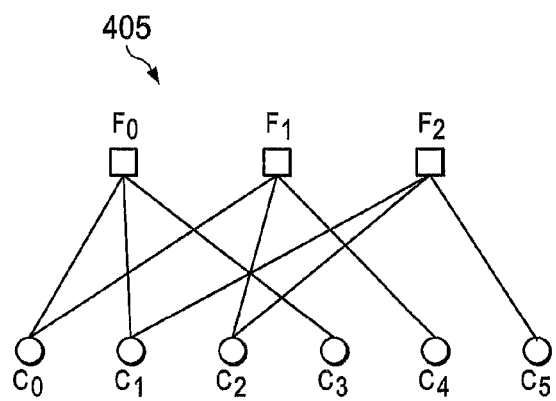
Figure 4C:
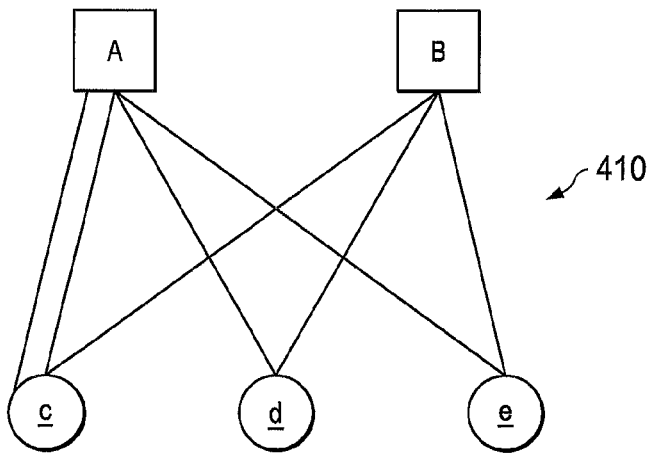
Figure 4D:
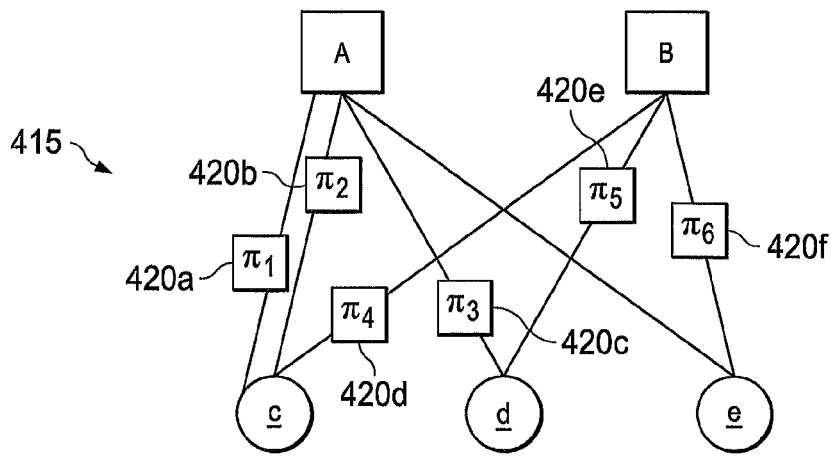

For example, the example protograph in FIG. 4C consists of two CN-types (A, and B) and three VN-types (c, d, and e). The obtained "vectorized" protograph 415, which represents the derived LDPC code, is illustrated in FIG. 4D, where A represents Z CNs of type A and B represents Z CNs of type $\overline{B}$ and similarly for the VNs. The boxes $\pi_e$ 420 along each Z-edge represents a permutation or adjacency matrix. The protograph 415 can also be described in a matrix form in the same way as writing the H matrix for a Tanner graph. For example, the protograph 415 can be characterized by parity check matrices $H_p$. The $H_p$-matrix can be represented by Equation 3:

$$H_p = \begin{array}{c} \\ A \\ B \end{array} \begin{matrix} c & d & e \\ \begin{bmatrix} 2 & 1 & 0 \\ 1 & 1 & 1 \end{bmatrix} \end{matrix}. \quad \text{[Eqn. 3]}$$

But, the non-zero entries in the matrix take values equal to the number of parallel edges connecting two neighboring nodes. The sum of the elements in any column is called column weight, Wc; and the sum of the elements in any row is called row weight, Wr.

For an attractive structured LDPC code, the protograph permutations should be in a circulant block form. That is, the permutation has the form $\pi_e = I^{(s)}$, where $I^{(s)}$ is the matrix resulting after s right cyclic-shifts of the identity matrix. For example, Equations 4a through 4c illustrate shifts of the identity matrix:

$$I^{(0)} = \begin{bmatrix} 1 & 0 & 0 \\ 0 & 1 & 0 \\ 0 & 0 & 1 \end{bmatrix}. \quad \text{[Eqn. 4a]}$$

$$I^{(1)} = \begin{bmatrix} 0 & 1 & 0 \\ 0 & 0 & 1 \\ 1 & 0 & 0 \end{bmatrix}. \quad \text{[Eqn. 4b]}$$

$$I^{(2)} = \begin{bmatrix} 0 & 0 & 1 \\ 1 & 0 & 0 \\ 0 & 1 & 0 \end{bmatrix}. \quad \text{[Eqn. 4c]}$$

Consequently, the derived LDPC code's H matrix can be written in term of these circulant permutations as follows: 1) Replace every '0' in the protograph matrix $H_p$ by the Z×Z all-zeroes matrix; 2) Replace every '1' in $H_p$ by one of the Z different $I^{(s)}$; and 3) Replace an element in $H_p$ with value x (>1) by the sum of x different $I^{(s)}$'s under the condition that no element in the resultant matrix is greater than one. For example, the construction of the LDPC H matrix of vectorized protograph 415 can be illustrated by Equation 5:

$$H = \begin{bmatrix} \pi_1 + \pi_2 & \pi_3 & 0 \\ \pi_4 & \pi_5 & \pi_6 \end{bmatrix}. \quad \text{[Eqn. 5]}$$

For example, using circulant blocks when Z=3, H can be represented by Equation 6:

$$H = \begin{bmatrix} I^{(0)} + I^{(1)} & I^{(0)} & 0 \\ I^{(0)} & I^{(1)} & I^{(2)} \end{bmatrix}. \quad \text{[Eqn. 6]}$$

Substituting s for $I^{(s)}$ and using −1 to indicate the Z×Z all zeros matrix, the H-matrix (now referred to as $H_{base}$) is represented in Equation 7:

$$H_{base} = \begin{bmatrix} 0+1 & 0 & -1 \\ 0 & 1 & 2 \end{bmatrix}. \quad \text{[Eqn. 7]}$$

Embodiments of the present disclosure provide a method of constructing an LDPC code family. The method includes constructing a mother code in the proposed family such that the mother code includes the highest rate. The remaining (other) codes in the family are generated by splitting the rows of the mother code. Furthermore, the rows in the mother code are not split randomly; rather, a protograph EXIT analysis is used to split the rows. In contrast, other methods for constructing an LDPC code family include constructing the mother code as the lowest rate code; then, the higher rate codes are derived by puncturing the base H matrix. However, this technique will first introduce codes with different code lengths. Second, codes with a large number of punctured nodes converge slowly, require more hardware cost, and consume more power. In addition, there are also techniques which start with the highest code rate as the mother code and then derive the higher rates code by deleting some rows in the mother code then adding circulant blocks (usually a large number of them is added). However, adding circulant blocks is not recommended for the reasons mentioned above. Additional techniques may start with the highest code rate as the mother code, but these techniques design the rows in the mother code in a way such that one can select two rows and merge them into one row. The cons of this method is that merging the rows can create cycles in the resultant code's graph, which are not desirable for reasons mentioned earlier in the document. In contrast, in some embodiments the rows are split such that no cycles of smaller size will be created in the derived code.

In some embodiments, a number of new families of LDPC codes are constructed such as, one of length 1344, one of length 2688 and one of length 2016. These codes have the characteristic that they are derived from the LDPC code family in the WiGig standard, which has code length 672. The code used to derive the families of codes is referred to as the mother family. The new code families inherit the following properties from the mother family: 1) the new code families include the same structures as the mother family; 2) as the mother family is 4-layers decodable, the new code families are also 4-layers decodable; 3) the new codes include the same row and column degree distribution as the mother family; and 4) the new codes can use the same decoding machine as the one used to decode the mother family.

FIG. 5 illustrates a mother code according to embodiments of the present disclosure. The embodiment of the mother code 500 shown in FIG. 5 is for illustration only. Other embodiments could be used without departing from the scope of this disclosure.

The mother code 500 can be a $13/16$ LDPC code. The mother code 500 includes a length of 672. In the example shown in FIG. 5, the base matrix of the mother code includes a number of blocks. For example, a first block 505 can include a value of '29' while another block 510 can include a value of '8.'

Figure 6:
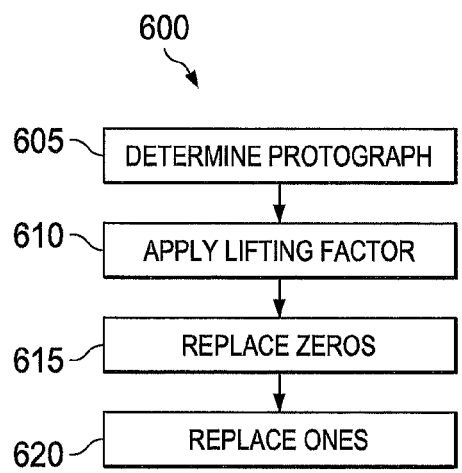
FIG. 6 illustrates a process for constructing an LDPC code according to embodiments of the present disclosure.

FIG. 6 illustrates a process for constructing an LDPC code according to embodiments of the present disclosure. The embodiment of the process 600 shown in FIG. 6 is for illustration only. Other embodiments could be used without departing from the scope of this disclosure.

In block 605, a protograph corresponding to each code in the LDPC mother family code. For example, FIG. 7 illustrates an example protograph 700 for the mother code 500.

In block 610, a protograph for each code is designed by applying a lifting factor. For example, a first protograph is designed in the 1344 code family by lifting the protograph 700 with $Z_b=2$. In addition, a second protograph is designed in the 2688 code family by lifting the protograph 700 with $Z_b=4$. Further, a third protograph can be designed in the 2016 code family by lifting the protograph 700 with $Z_b=3$. It will be understood that using lifting factors of '2', '3' and '4' is for example only and other values can be used without departing from the scope of this disclosure. In every case, the lifting is chosen that minimizes the number of cycles of size 4 in the resulting protograph.

The base matrices for these codes are derived in blocks 615 and 620. In block 615, each zero in the protograph is replaced by the Z×Z all-zeros matrix. For example, each '0' in the protograph 700 is replaced by −1. In block 620 every $Z_b$ ones, which are in the same $Z_b \times Z_b$ circulant block, are replaced by the corresponding value in the base matrix of the corresponding code in the mother family.

FIG. 8 illustrates a designed lifting with a lifting factor of 2 according to embodiments of the present disclosure. The embodiment of the lifting 800 shown in FIG. 8 is for illustration only. Other embodiments could be used without departing from the scope of this disclosure.

Figures 9, 10:
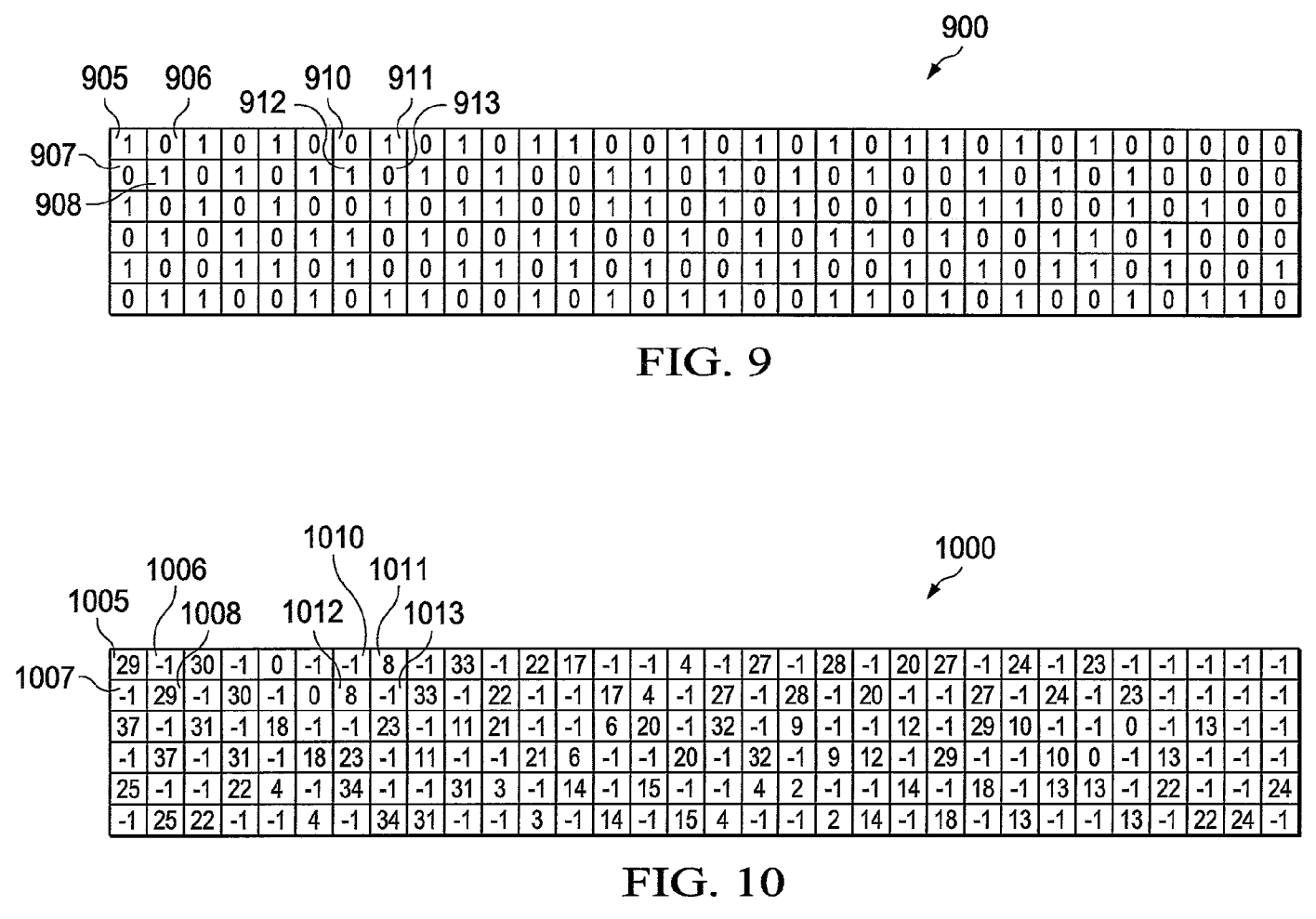

The lifting 800 can be used to obtain a $13/16$ code with length 1344. A $13/16$ protograph 900, as shown in FIG. 9, with code length 1344 is constructed by applying the lifting 800 to the protograph 700. For example, blocks 905-908 are derived by applying block 805 (e.g., circulants described herein above with respect to FIG. 4) to the one in block 705. Therefore, block 905 and block 908 includes ones while block 706 and 707 include zeros. Alternatively, blocks 910-913 are derived by applying block 810 (as described herein above with respect to FIG. 4) to block 710. For example, block 910 and block 913 includes zeros while block 911 and block 912 include ones. Thereafter, as illustrated herein above with respect to blocks 615 and 620, the zeros and ones are replaced by '−1' and the values of the mother code 500 respectively to construct the new code.

FIG. 10 illustrates a $13/16$ code with length 1344 according to embodiments of the present disclosure. The embodiment of the $13/16$ code 1000 shown in FIG. 10 is for illustration only. Other embodiments could be used without departing from the scope of this disclosure.

The $13/16$ code 1000 includes a length of 1344. The $13/16$ code 1000 also inherits the following properties from the mother family: 1) the new code families include the same structures as the mother family; 2) as the mother family is 4-layers decodable, the new code families are also 4-layers decodable; 3) the new codes include the same row and column degree distribution as the mother family; and 4) the new codes can use the same decoding machine as the one used to decode the mother family.

In the example shown in FIG. 10, the $13/16$ code 1000 is constructed by applying $13/16$ code protograph 900 to the mother code 500. For example, the ones in block 905 and block 908 are replaced by the value of '29' from block 505 and placed in blocks 1005 and 1008 respectively. Additionally, the zeros in block 906 and block 907 are replaced by '−1' and placed in blocks 1006 and 1007 respectively. The zeros in block 910 and block 913 are replaced by '−1' and placed in blocks 1010 and 1013 while the ones in blocks 911 and 912 are replaced by the value of '8' from block 510 and placed in blocks 1010 and 1013.

FIGS. 11A through 11K illustrate lifting rates according to embodiments of the present disclosure. The embodiments of the lifting rates shown in FIGS. 11A through 11K are for illustration only. Other embodiments could be used without departing from the scope of this disclosure.

Figures 11A, 11B, 11C:
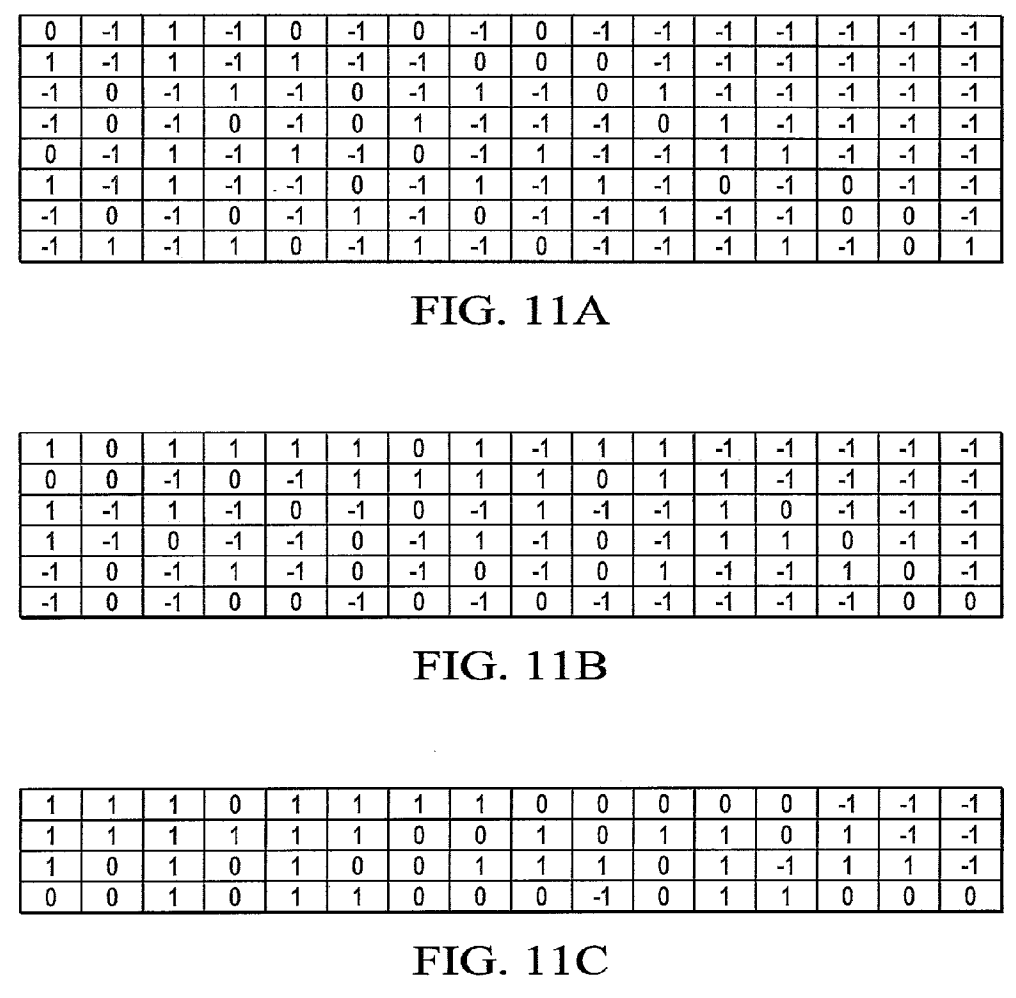
Figures 11D, 11E, 11F:
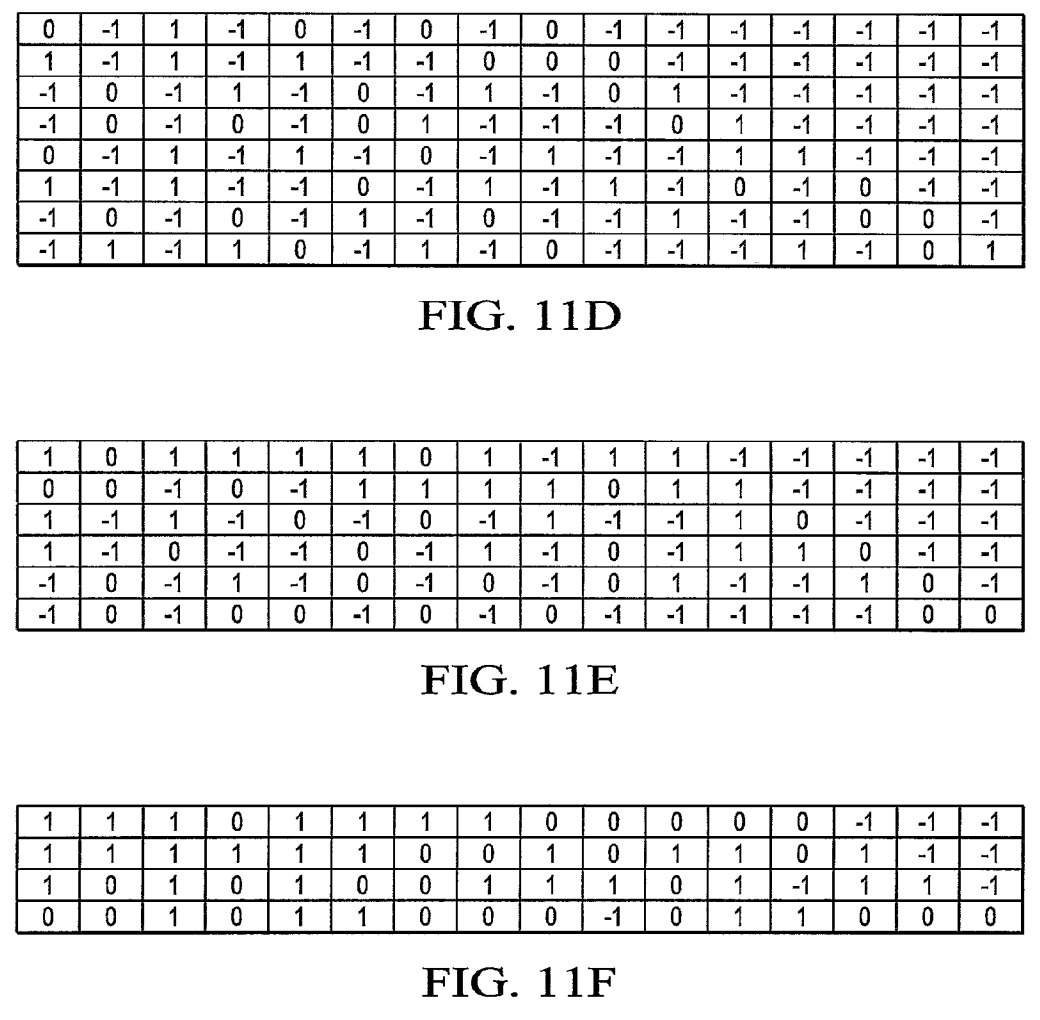
Figures 11G, 11H, 11I:
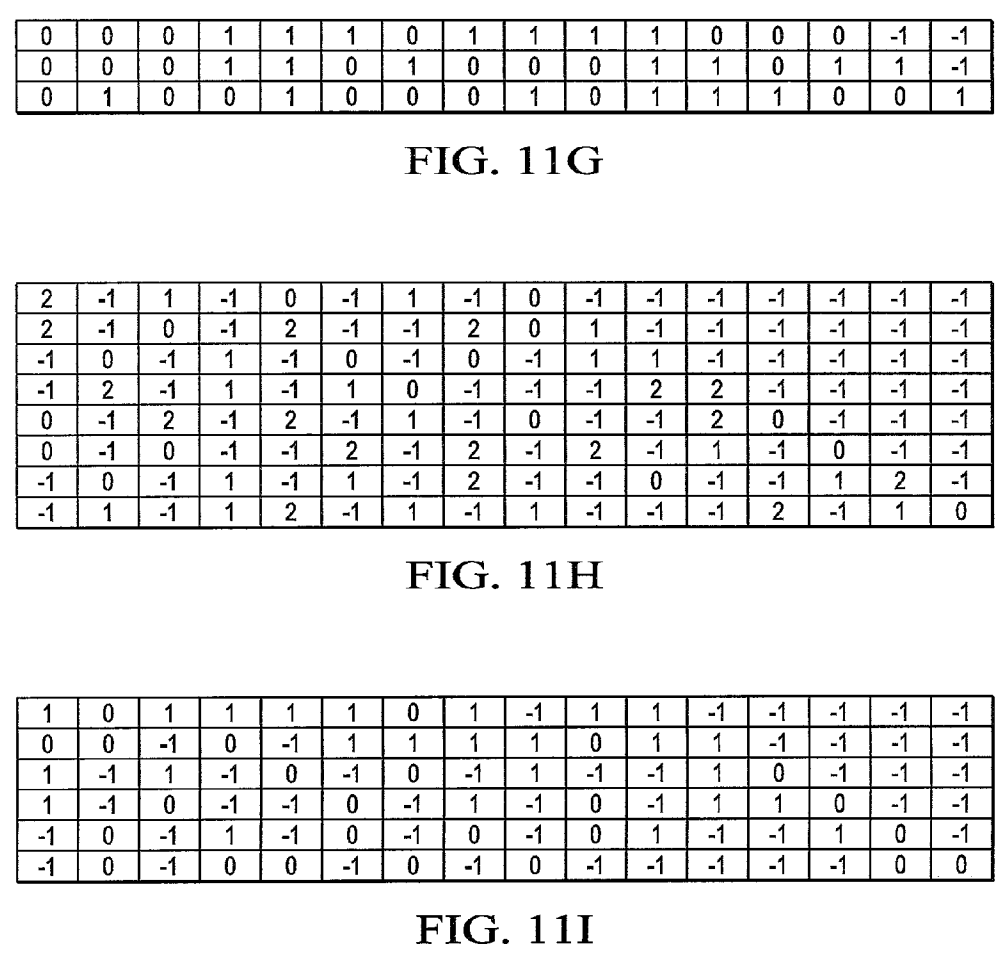
Figures 11J, 11K, 12A:
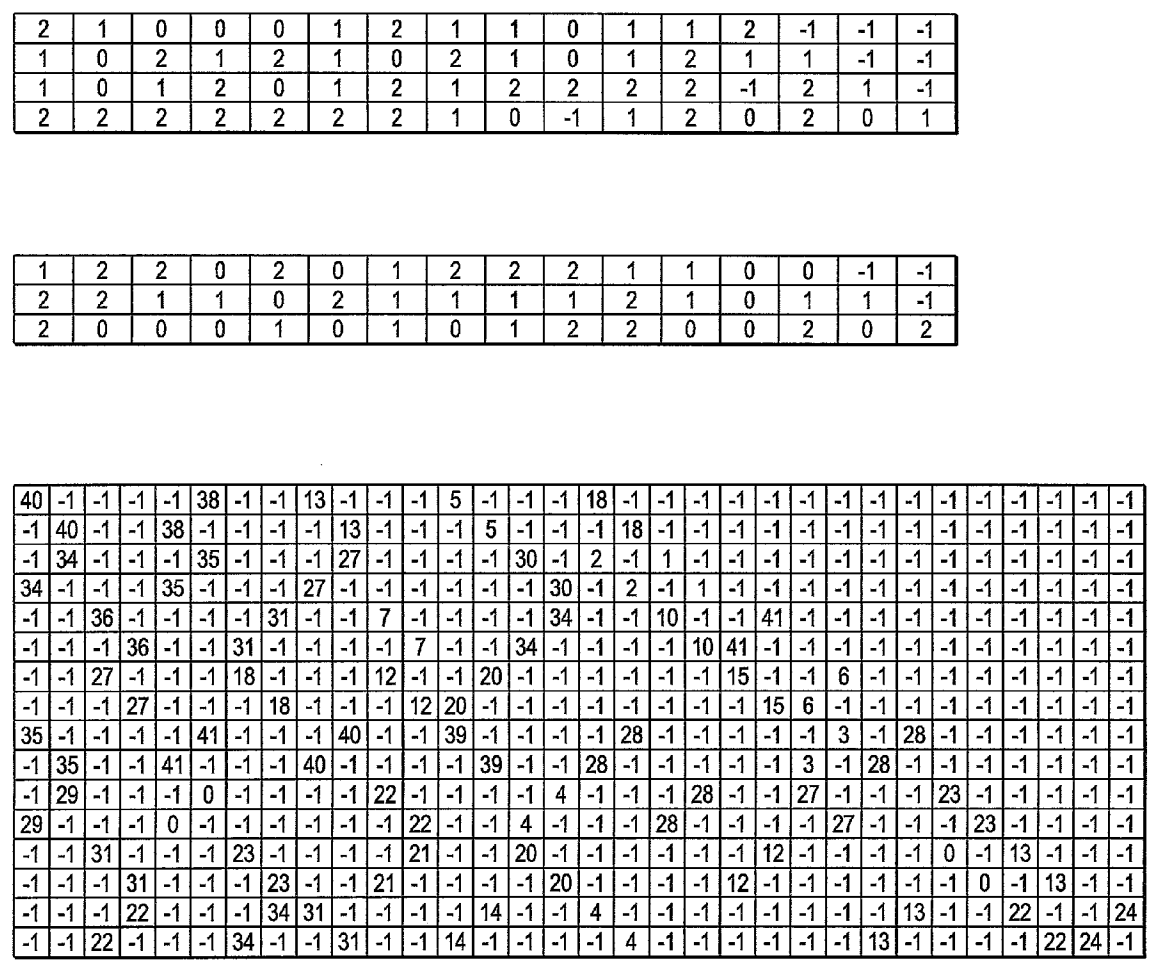

Using the construction process 600, described above with reference to FIG. 6, the following splitting rules were obtained to generate the other codes in the LDPC family. FIG. 11A illustrates a rate-½ lifting rate for code length 1344 with lifting $Z_b=2$. FIG. 11B illustrates a rate-⅝ lifting rate for code length 1344 with lifting $Z_b=2$. FIG. 11C illustrates a rate-¾ lifting rate for code length 1344 with lifting $Z_b=2$. FIG. 11D illustrates a rate-½ lifting rate for code length 2688 with lifting $Z_b=4$. FIG. 11E illustrates a rate-⅝ lifting rate for code length 2688 with lifting $Z_b=4$. FIG. 11F illustrates a rate-¾ lifting rate for code length 2688 with lifting $Z_b=4$. FIG. 11G illustrates a rate-$13/16$ lifting rate for code length 2688 with lifting $Z_b=4$. FIG. 11H illustrates a rate-½ lifting rate for code length 2016 with lifting $Z_b=3$. FIG. 11I illustrates a rate-⅝ lifting rate for code length 2016 with lifting $Z_b=3$. FIG. 11J illustrates a rate-¾ lifting rate for code length 2016 with lifting $Z_b=3$. FIG. 11K illustrates a rate-$13/16$ lifting rate for code length 2016 with lifting $Z_b=3$.

FIGS. 12A through 12K illustrate LDPC code families according to embodiments of the present disclosure. The embodiments of the lifting rates shown in FIGS. 12A through 12K are for illustration only. Other embodiments could be used without departing from the scope of this disclosure.

Using the construction process 600, described above with reference to FIG. 6, the following code families can be obtained. FIG. 12A depicts a rate-½ code with length 1344.

Figures 12B, 12C:
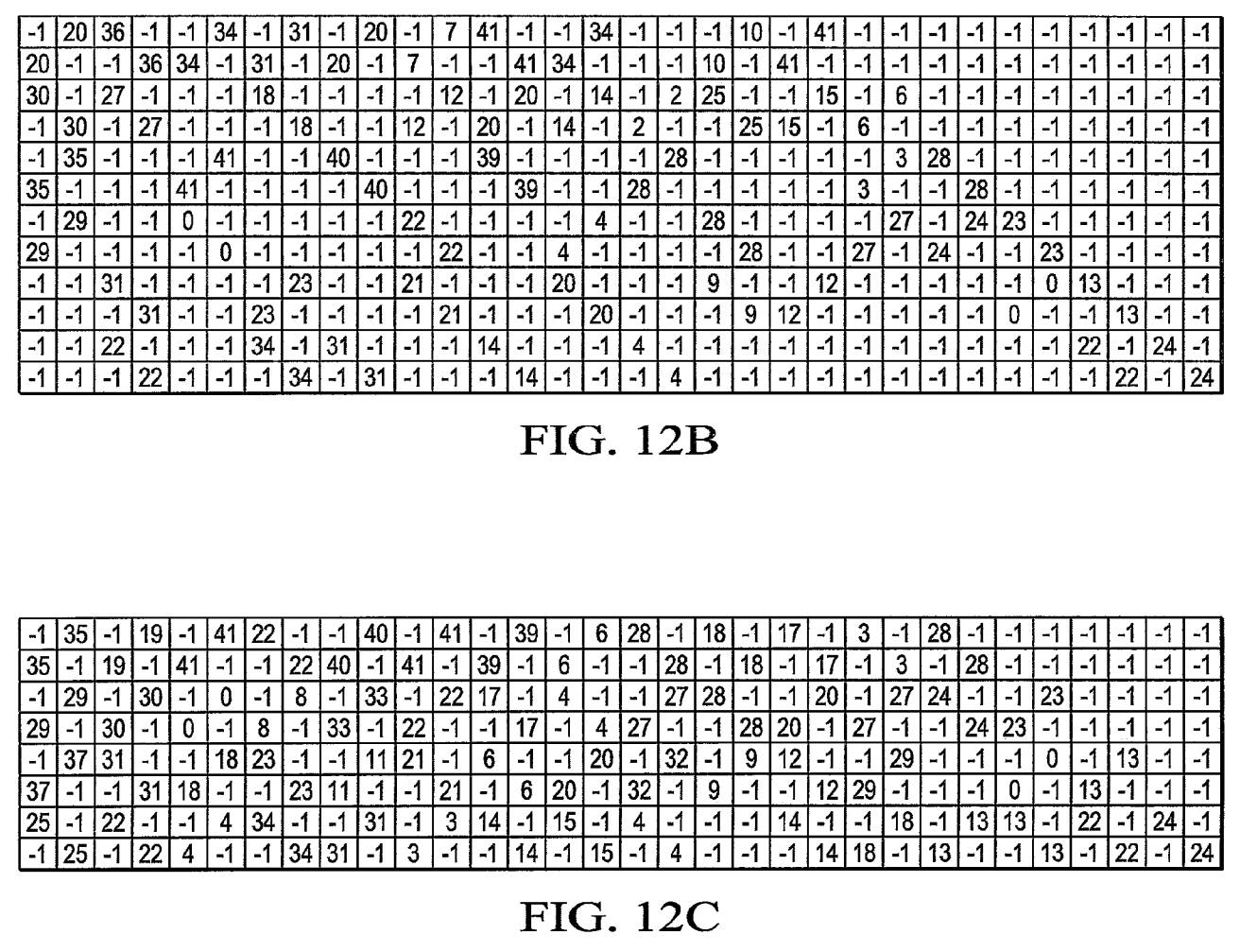
Figure 12D-1:
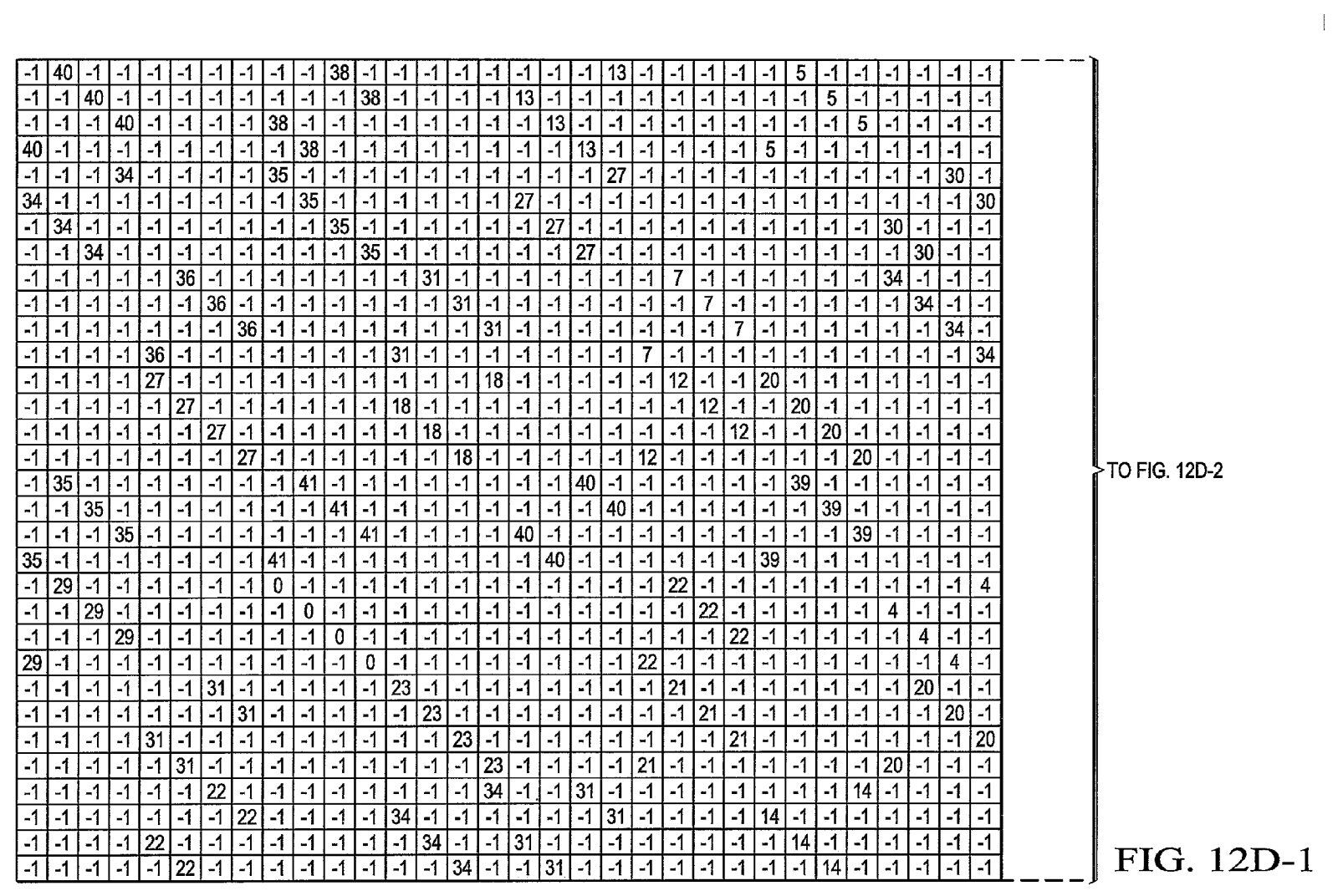
Figure 12D-2:
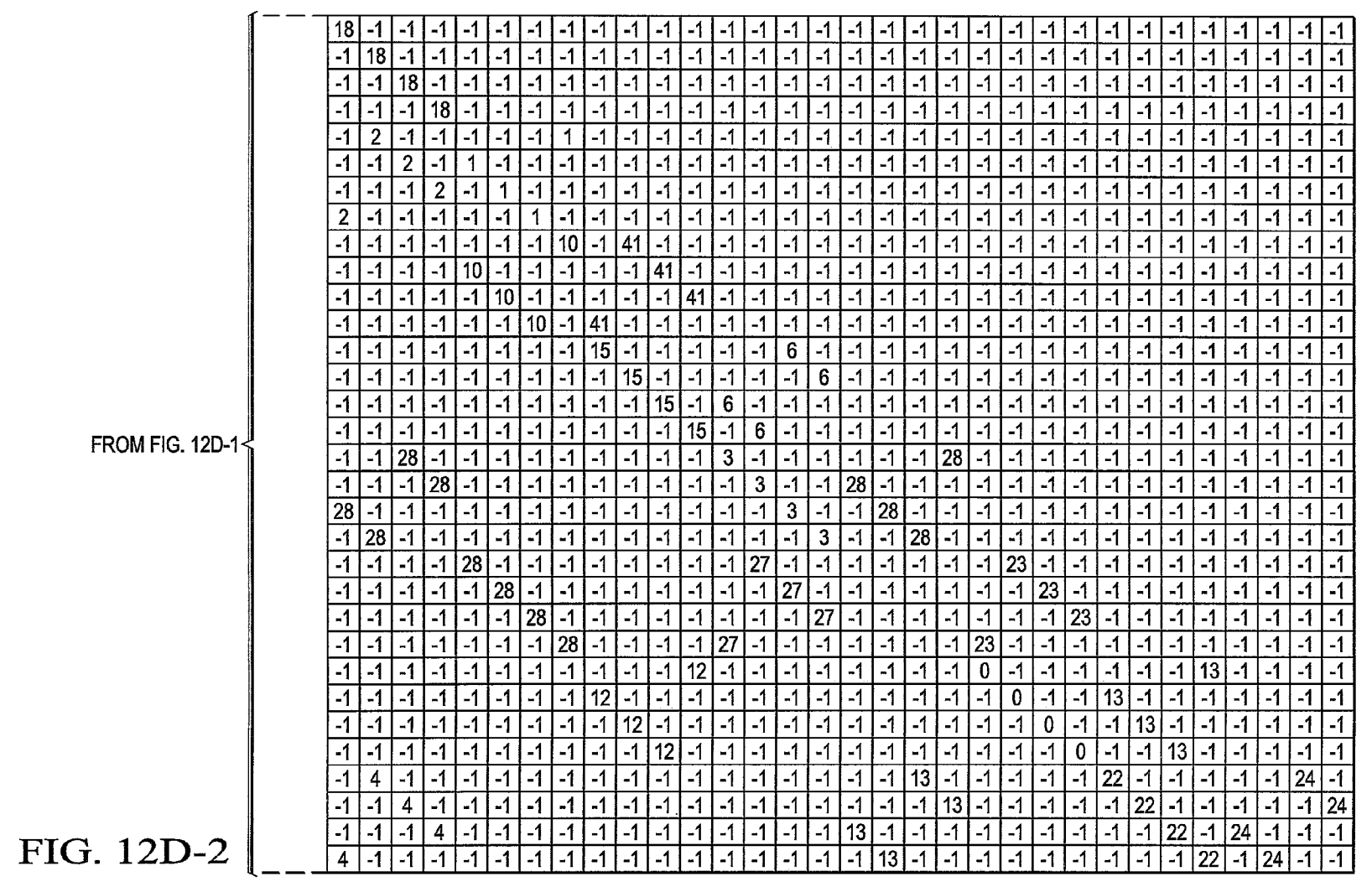
Figure 12E-1:
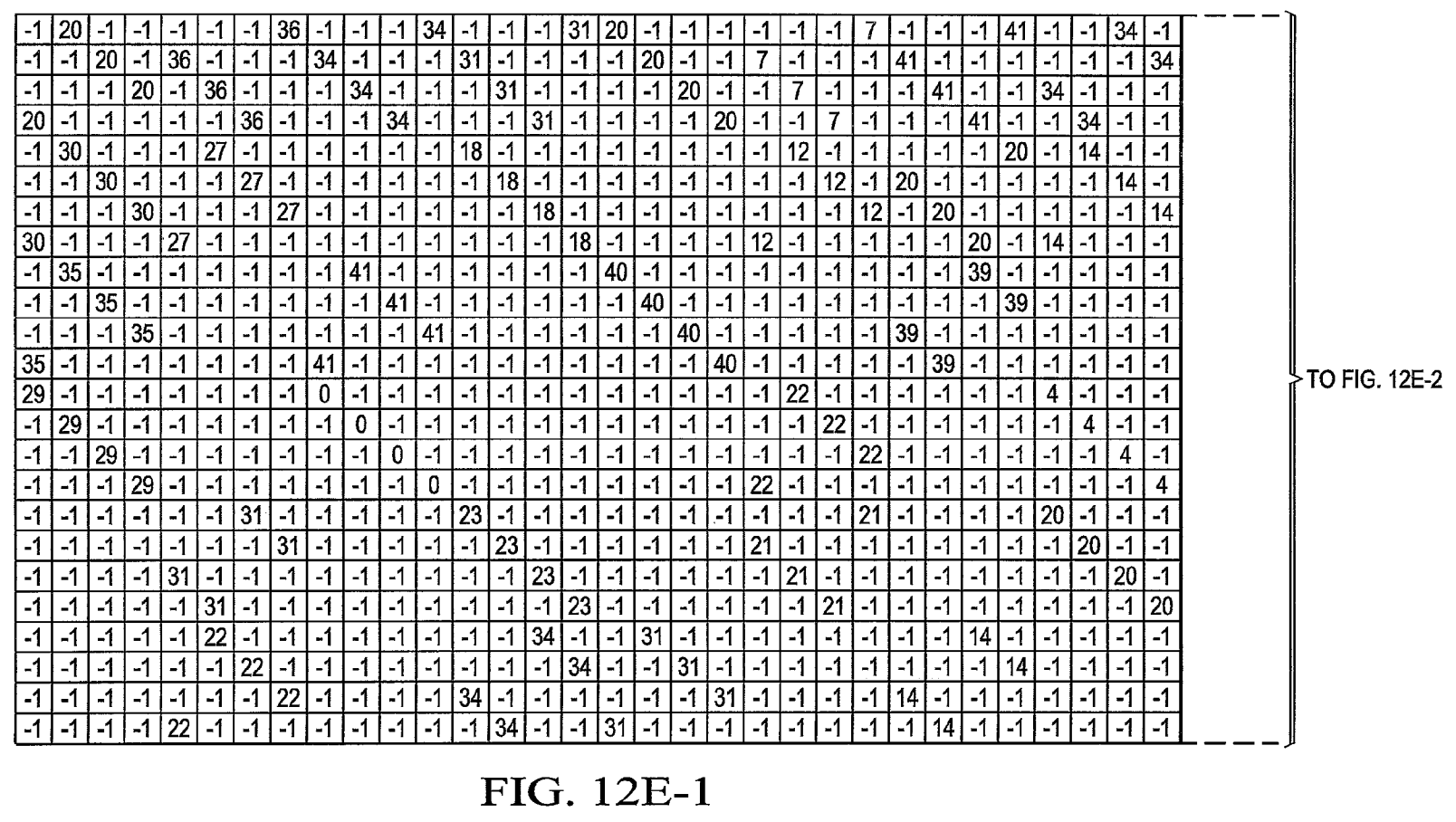
Figure 12E-2:
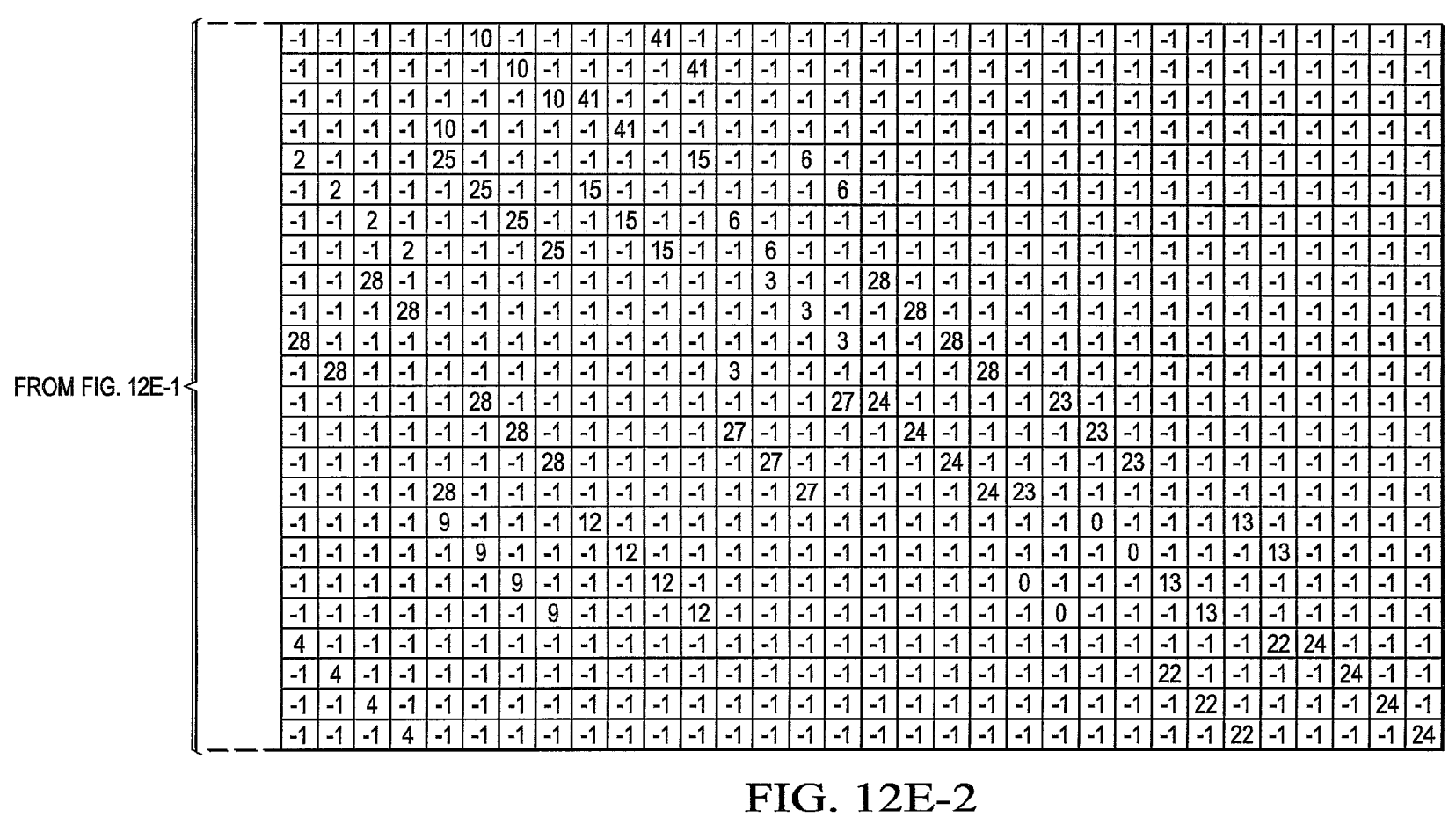
Figure 12F:
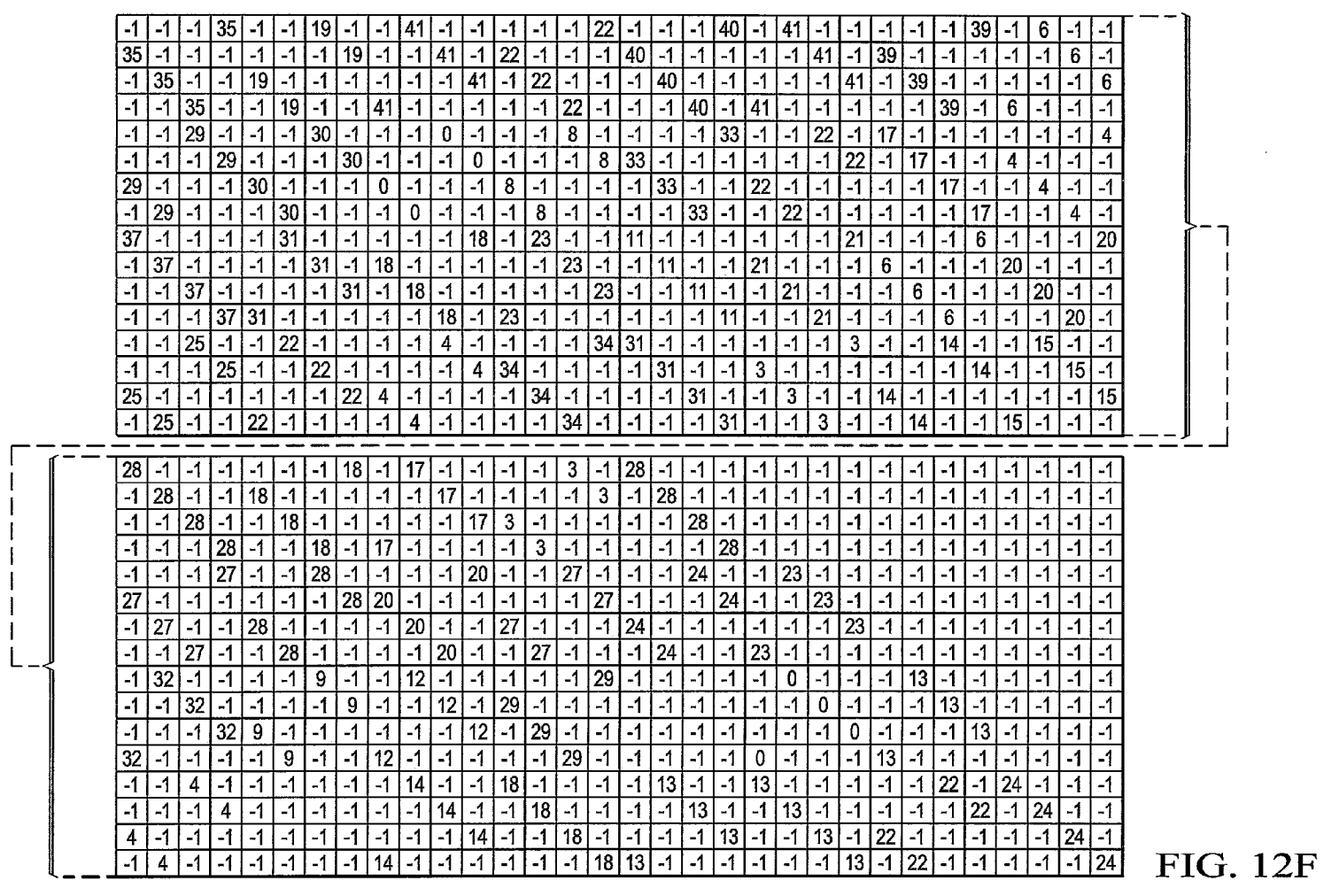
Figure 12G:
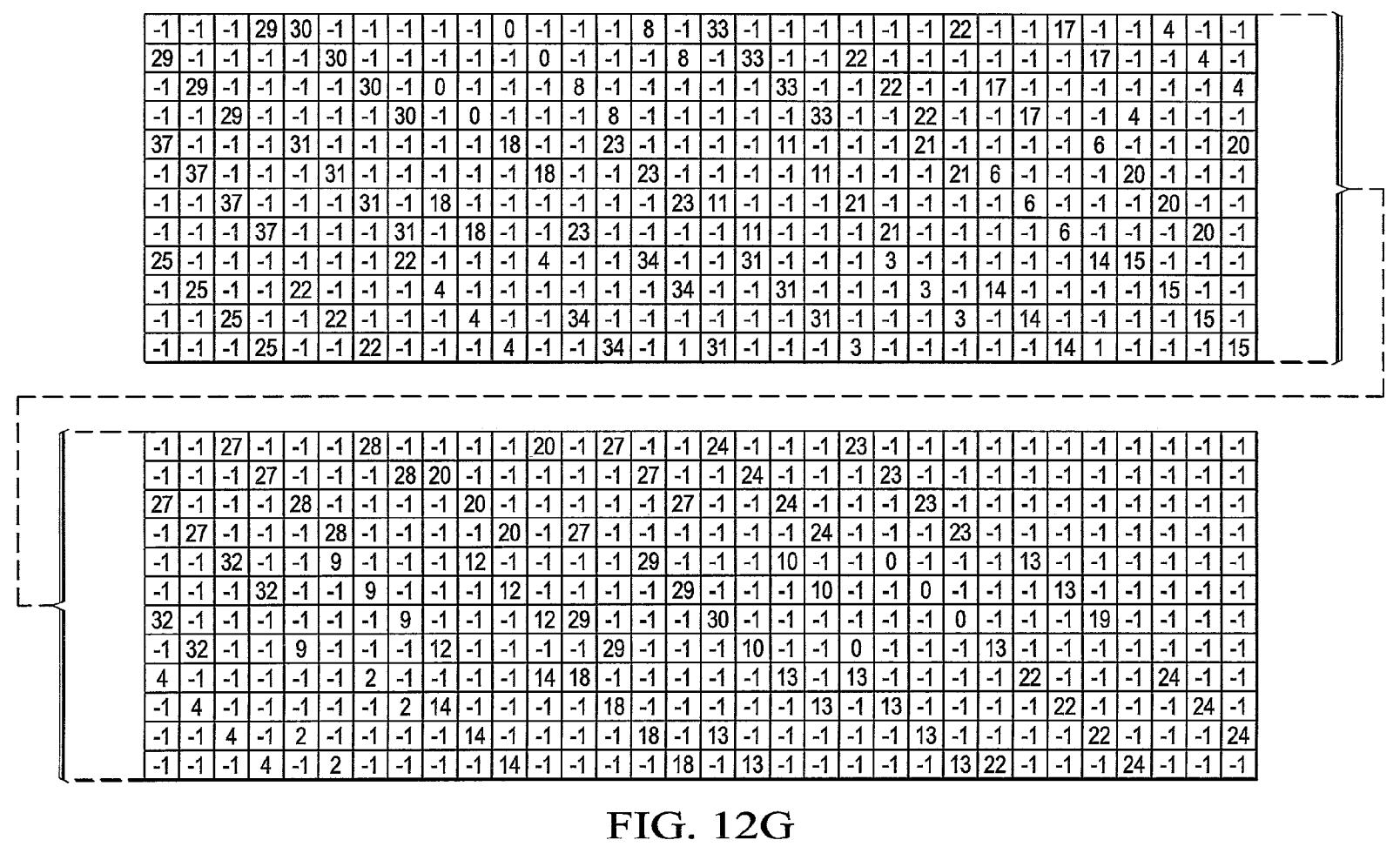
Figure 12H-1:
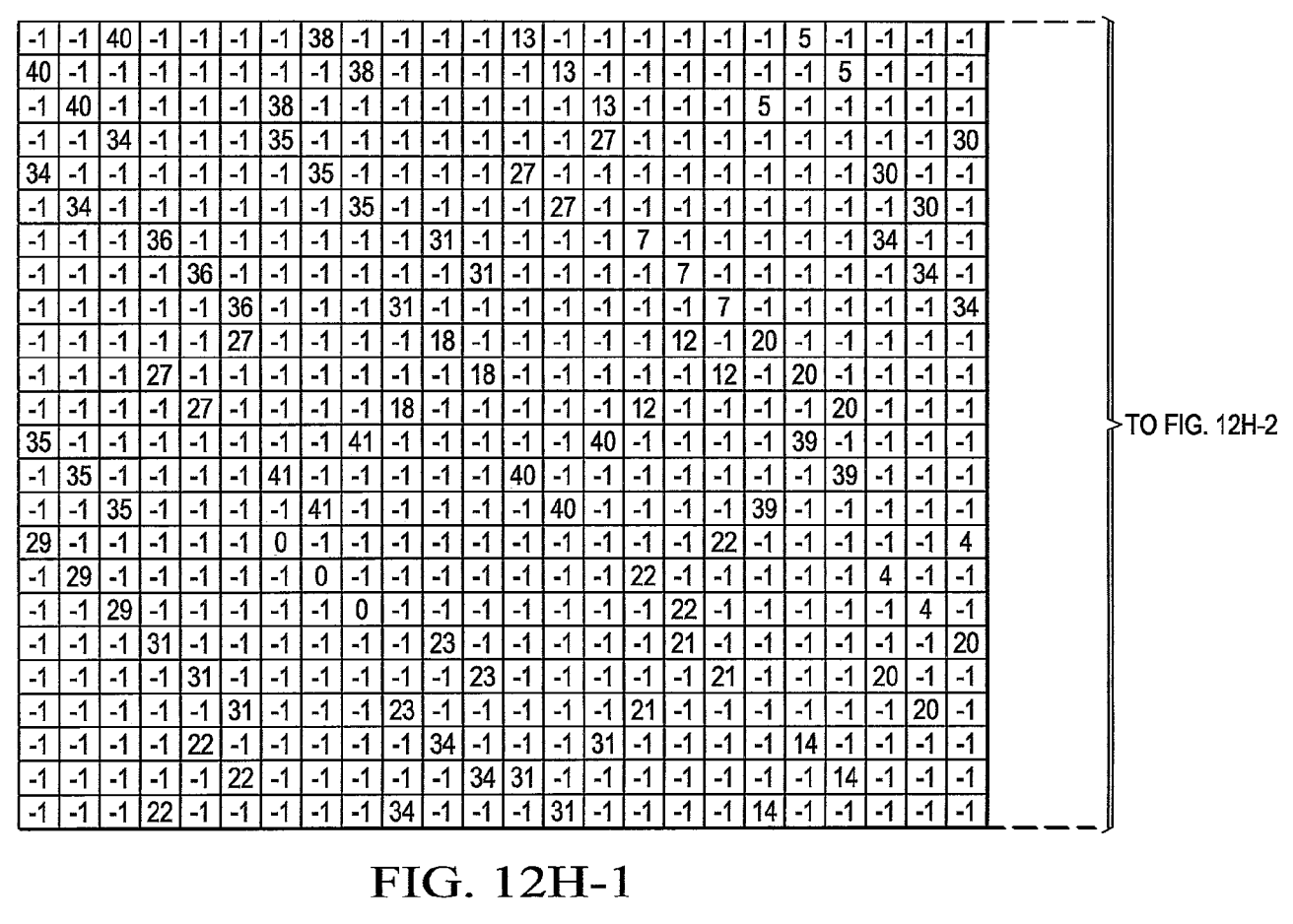
Figure 12H-2:
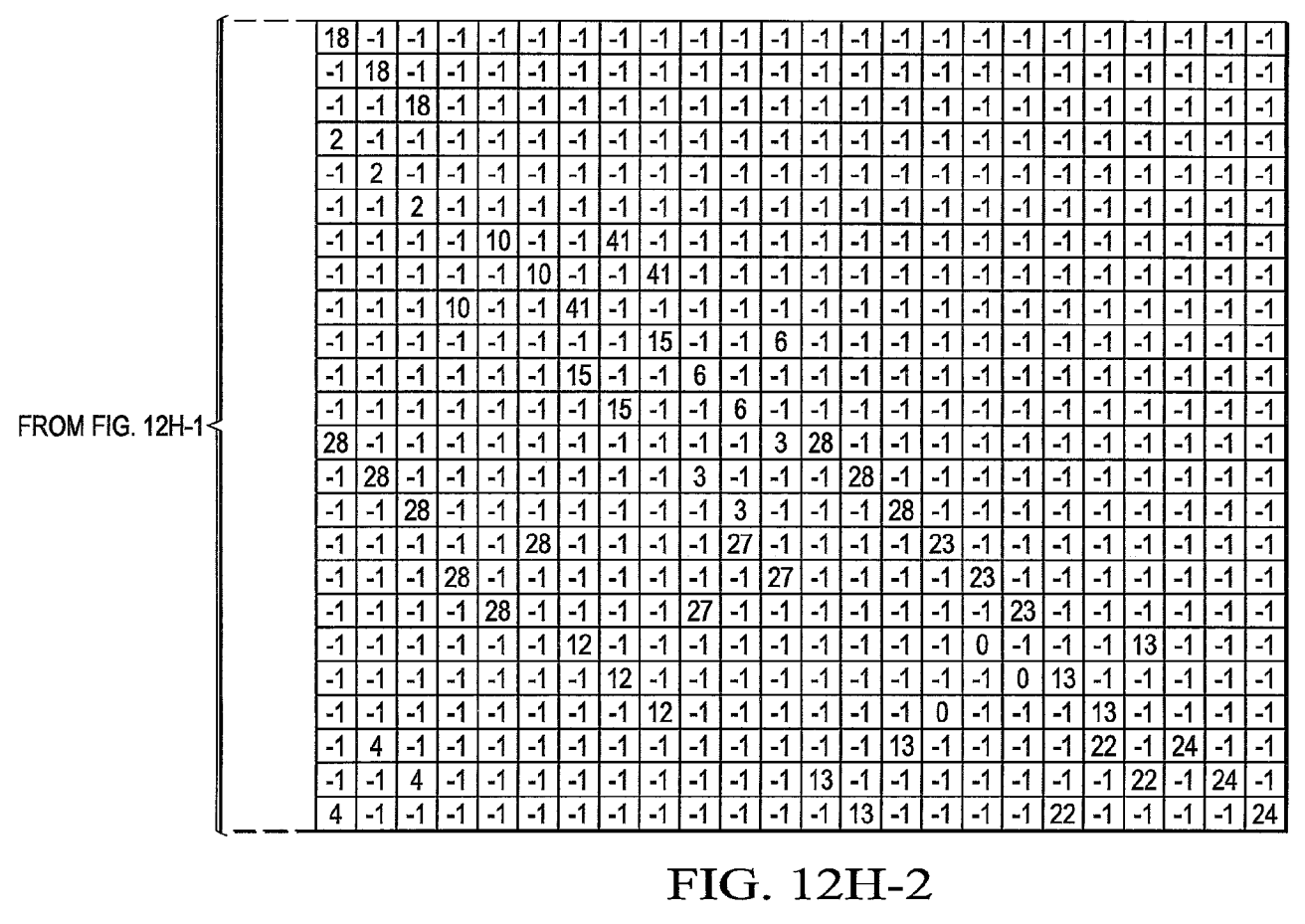
Figure 12I-2:
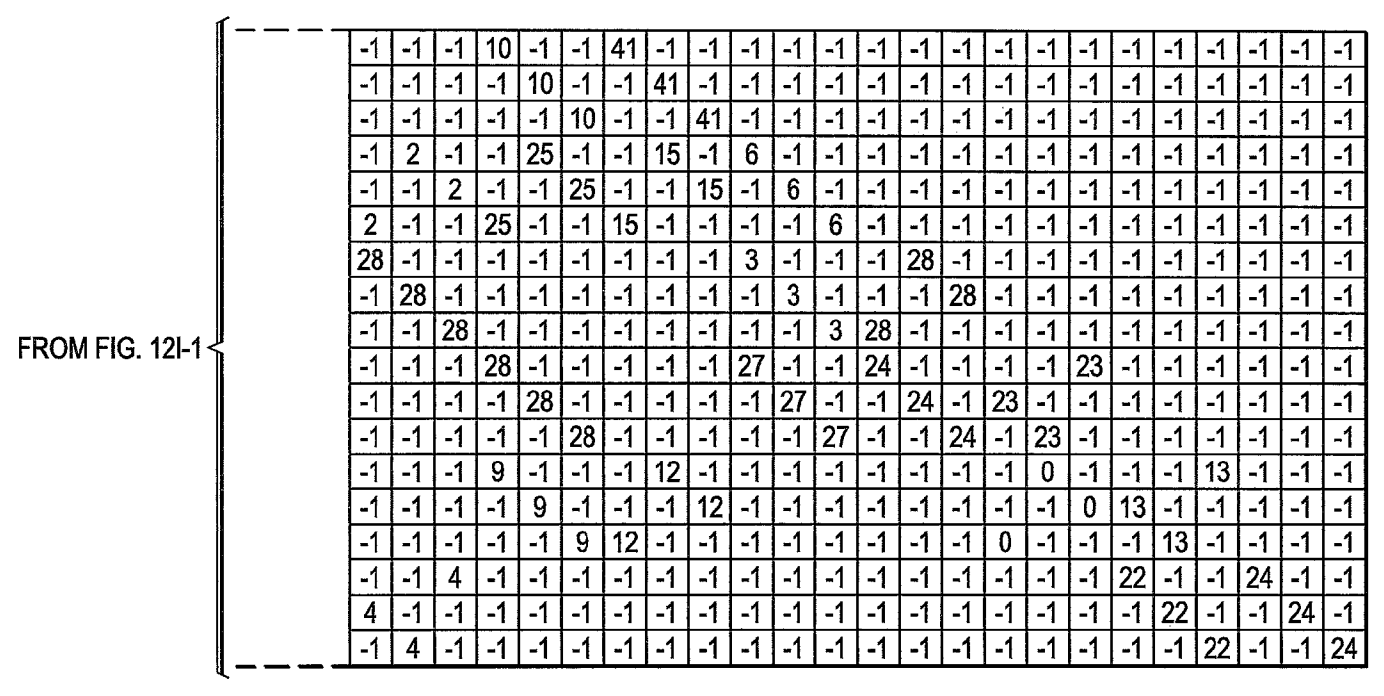
Figure 12J:
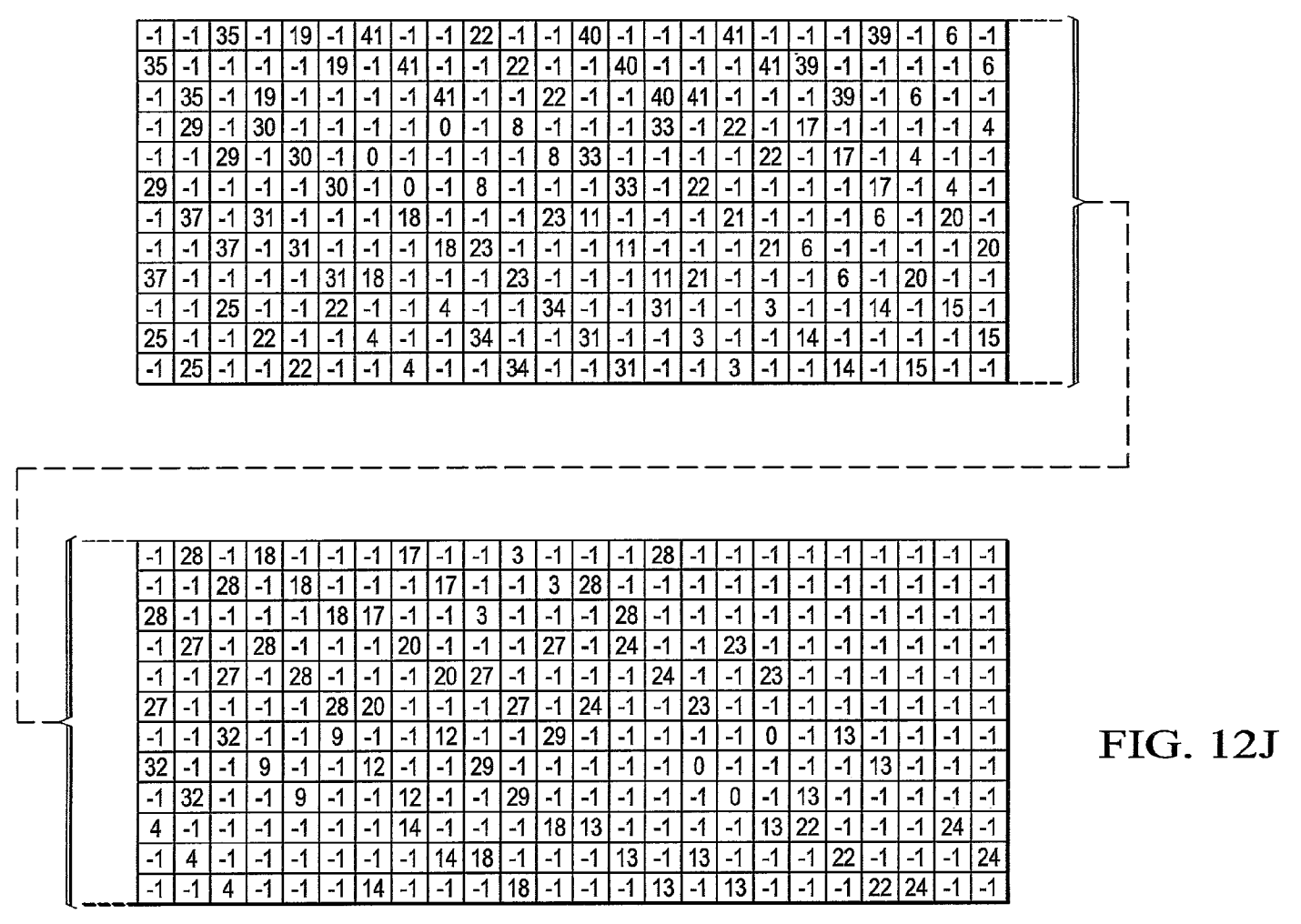
Figure 12K:
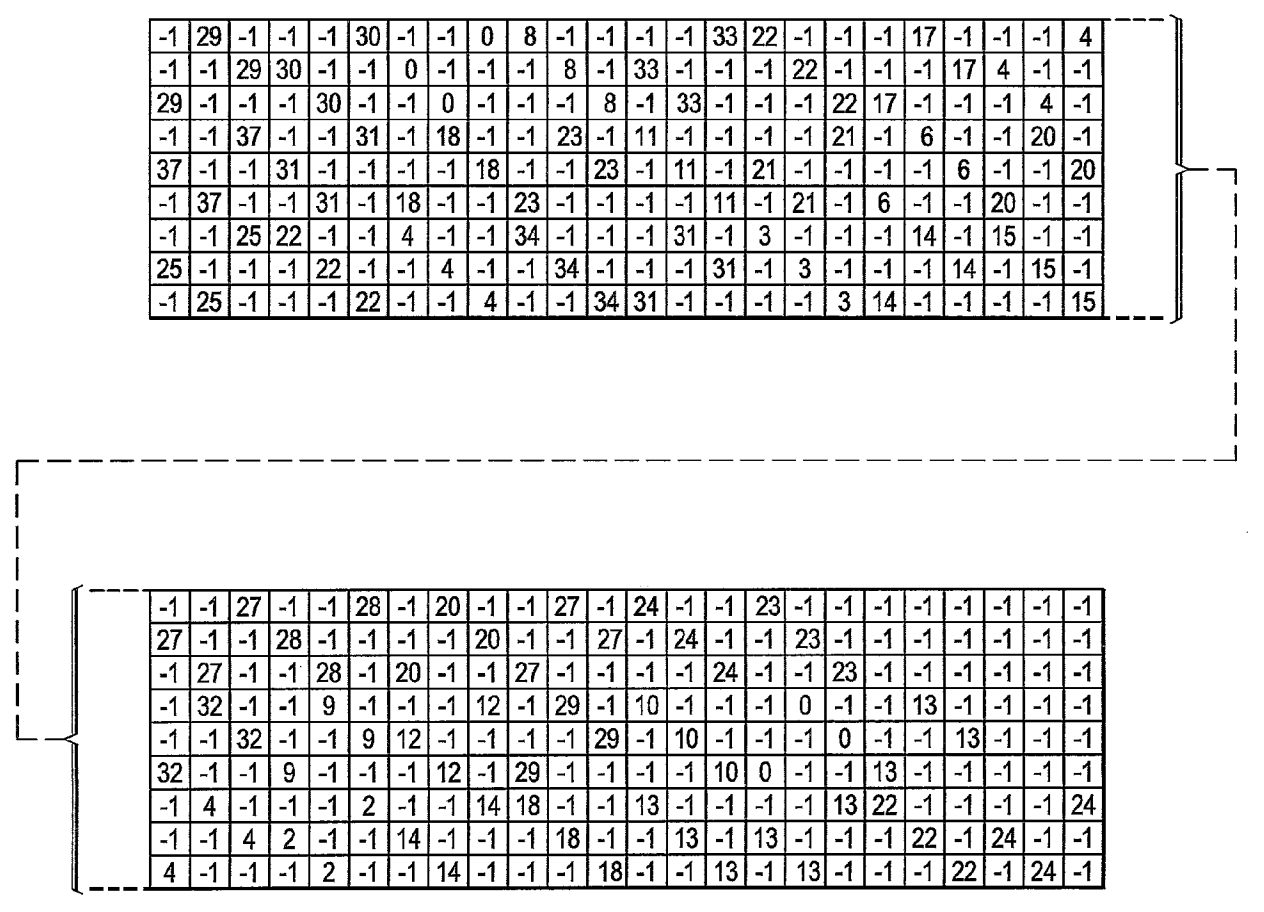

FIG. 11B depicts a rate-⅝ code with length 1344. FIG. 12C depicts a rate-¾ code with length 1344. FIGS. 12D-1 and 12D-2 depict a rate-½ code with length 2688. FIGS. 12E-1 and 12E-2 depict a rate-⅝ code with length 2688. FIG. 12F depicts a rate-¾ code with length 2688. FIG. 12G depicts a rate-13/16 code with length 2688. FIGS. 12H-1 and 12H-2 depict a rate-½ code with length 2016. FIGS. 12I-1 and 12I-2 depict a rate-⅝ code with length 2016. FIG. 12J depicts a rate-¾ code with length 2016. FIG. 12K depicts a rate-13/16 code with length 2016.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A method for constructing a low density parity check (LDPC) family of codes, the method comprising:
   determining, by a Context-based operation Reconfigurable Instruction Set Processor (CRISP), a protograph for a mother code for the LDPC family of codes;
   lifting the protograph by a lifting factor to design a code specific protograph for a code; and
   constructing a base matrix for the code, the base matrix constructed by:
      replacing each zero in the code specific protograph with a '−1'; and
      replacing each one in the code specific protograph with a corresponding value from the mother matrix.

2. The method as set forth in claim 1, wherein the mother code comprises a code length of 672.

3. The method as set forth in claim 1, further comprising selecting circulant blocks, wherein the selecting comprises:
   lifting the protograph by a lifting factor of one of 2, 3 and 4.

4. The method as set forth in claim 1, further comprising deriving a second code from the mother code, wherein the second code comprises a second code rate that is lower than the highest code rate.

5. The method as set forth in claim 4, wherein the second code comprises at least one of a rate-⅝ code; a rate-½ code and a rate-¾ code.

6. The method as set forth in claim 4, wherein the second code comprises a length of at least one of 1344, 2016 and 2688.

7. The method as set forth in claim 4, wherein the constructed codes comprise at least one of:
   a same structures as the mother code;
   a 4-layers decodable;
   a same row and column degree distribution as the mother code; and
   can be decoded by a same decoder as the mother code.

8. A Context-based operation Reconfigurable Instruction Set Processor (CRISP) decoder configured perform an error correction using a low density parity check (LDPC) code, the LDPC code comprising:
   a codeword size of at least 1344;
   a plurality of information bits; and
   a plurality of parity bits, wherein the LDPC code is based on a mother code of code length 672, wherein the LDPC code is constructed by:
      determining a protograph for a mother code for the LDPC family of codes;
      lifting the protograph by a lifting factor to design a code specific protograph for a code; and
      constructing a base matrix for the code, the base matrix constructed by:
         replacing each zero in the code specific protograph with a '−1'; and
         replacing each one in the code specific protograph with a corresponding value from the mother matrix.

9. The decoder as set forth in claim 8, further comprising at least one of:
   a same structures as the mother code;
   a 4-layers decodable;
   a same row and column degree distribution as the mother code; and
   can be decoded by a same decoder as the mother code.

10. The decoder as set forth in claim 8, wherein the construction of the LDPC code further comprises:
    selecting circulant blocks, wherein the selecting comprises:
       lifting the protograph by a lifting factor of one of 2, 3 and 4.

11. The decoder as set forth in claim 8, further configured to derive a second code from the mother code, wherein the second code comprises a second code rate that is lower than the highest code rate.

12. The decoder as set forth in claim 11, wherein the second code comprises at least one of a rate-⅝ code; a rate-½ code and a rate-¾ code.

13. The decoder as set forth in claim 11, wherein the second code comprises a length of at least one of 1344, 2016 and 2688.

14. A method comprising:
    performing, by a Context-based operation Reconfigurable Instruction Set Processor (CRISP), an error correction using a low density parity check (LDPC) code from a LDPC family of codes, the LDPC code comprising:
    a codeword size of at least 1344;
    a plurality of information bits; and
    a plurality of parity bits, wherein the LDPC code is based on a mother code, wherein the LDPC code is constructed by:
       determining a protograph for a mother code for the LDPC family of codes;
       lifting the protograph by a lifting factor to design a code specific protograph for a code; and
       constructing a base matrix for the code, the base matrix constructed by:
          replacing each zero in the code specific protograph with a '−1'; and
          replacing each one in the code specific protograph with a corresponding value from the mother matrix.

15. The method as set forth in claim 14, wherein the mother code comprises a code length of 672.

16. The method as set forth in claim 14, further comprising selecting circulant blocks, wherein the selecting comprises:
    lifting the protograph by a lifting factor of one of 2, 3 and 4.

17. The method as set forth in claim 14, further comprising deriving a second code from the mother code, wherein the second code comprises a second code rate that is lower than the highest code rate.

18. The method as set forth in claim 17, wherein the second code comprises at least one of a rate-⅝ code; a rate-½ code and a rate-¾ code.

19. The method as set forth in claim 17, wherein the second code comprises a length of at least one of 1344, 2016 and 2688.

20. The method as set forth in claim 17, wherein the constructed codes comprise at least one of:
    a same structures as the mother code;
    a 4-layers decodable;

a same row and column degree distribution as the mother code; and can be decoded by a same decoder as the mother code.

\* \* \* \* \*